(12) United States Patent
Fresco et al.

(10) Patent No.: US 8,426,970 B2
(45) Date of Patent: Apr. 23, 2013

(54) SUBSTRATE PROCESSING INCLUDING A MASKING LAYER

(75) Inventors: Zachary Fresco, San Jose, CA (US); Chi-I Lang, Cupertino, CA (US); Sandra G. Malhotra, San Jose, CA (US); Tony P. Chiang, Campbell, CA (US); Thomas R. Boussie, Menlo Park, CA (US); Nitin Kumar, Fremont, CA (US); Jinhong Tong, Santa Clara, CA (US); Anh Duong, Union City, CA (US)

(73) Assignee: Intermolecular, Inc., San Jose, CA (US)

( * ) Notice: Subject to any disclaimer, the term of this patent is extended or adjusted under 35 U.S.C. 154(b) by 240 days.

(21) Appl. No.: 12/979,627

(22) Filed: Dec. 28, 2010

(65) Prior Publication Data

US 2012/0001320 A1 Jan. 5, 2012

Related U.S. Application Data

(62) Division of application No. 11/647,882, filed on Dec. 29, 2006, now Pat. No. 7,879,710.

(51) Int. Cl.
*H01L 23/52* (2006.01)
*H01L 23/532* (2006.01)

(52) U.S. Cl.
USPC ............... 257/760; 257/759; 257/E23.142; 257/E23.167; 438/624

(58) Field of Classification Search ............... 438/624; 257/758, 759, 760, E23.017, E23.019, E23.142, 257/E23.167
See application file for complete search history.

(56) References Cited

U.S. PATENT DOCUMENTS

| | | | | |
|---|---|---|---|---|
| 7,390,739 B2 * | 6/2008 | Lazovsky et al. | ............. | 438/653 |
| 7,749,881 B2 * | 7/2010 | Lazovsky et al. | ............. | 438/597 |
| 7,879,710 B2 * | 2/2011 | Fresco et al. | ................. | 438/597 |
| 7,902,063 B2 * | 3/2011 | Chiang et al. | ................. | 438/627 |
| 8,030,772 B2 * | 10/2011 | Lazovsky et al. | ............. | 257/751 |
| 8,084,400 B2 * | 12/2011 | Chiang et al. | .................. | 506/23 |
| 8,193,090 B2 * | 6/2012 | Lazovsky et al. | ............. | 438/653 |
| 2004/0248409 A1 * | 12/2004 | Padhi et al. | ................. | 438/653 |
| 2005/0045997 A1 * | 3/2005 | Brunner et al. | ............... | 257/635 |
| 2006/0261434 A1 * | 11/2006 | Lazovsky et al. | ............. | 257/499 |
| 2007/0166989 A1 * | 7/2007 | Fresco et al. | .................. | 438/597 |
| 2008/0246150 A1 * | 10/2008 | Lazovsky et al. | ............. | 257/751 |
| 2009/0250078 A1 * | 10/2009 | Fresco | ............................ | 134/4 |
| 2009/0291275 A1 * | 11/2009 | Tong et al. | .................... | 428/209 |
| 2011/0101536 A1 * | 5/2011 | Chiang et al. | ................. | 257/773 |
| 2012/0001320 A1 * | 1/2012 | Fresco et al. | .................. | 257/734 |

* cited by examiner

*Primary Examiner* — Mary Wilczewski

(57) ABSTRACT

Methods for substrate processing are described. The methods include forming a material layer on a substrate. The methods include selecting constituents of a molecular masking layer (MML) to remove an effect of variations in the material layer as a result of substrate processing. The methods include normalizing the surface characteristics of the material layer by selectively depositing the MML on the material layer.

10 Claims, 15 Drawing Sheets

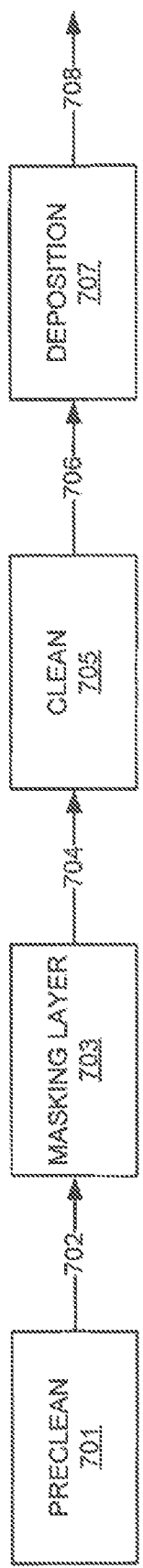
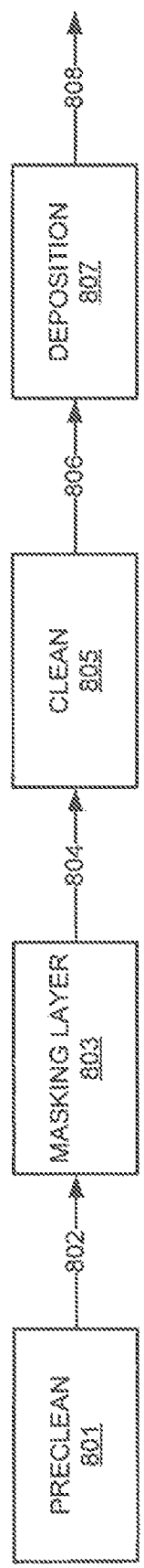
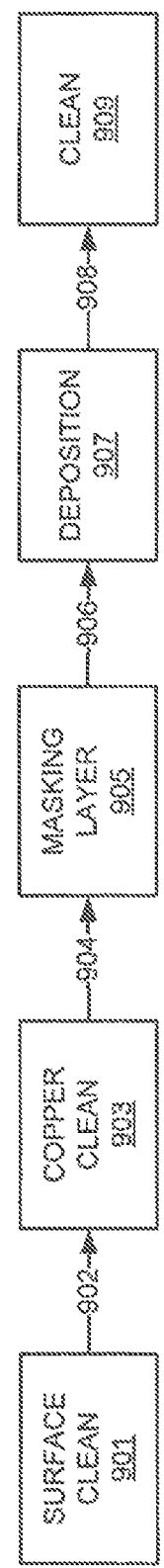

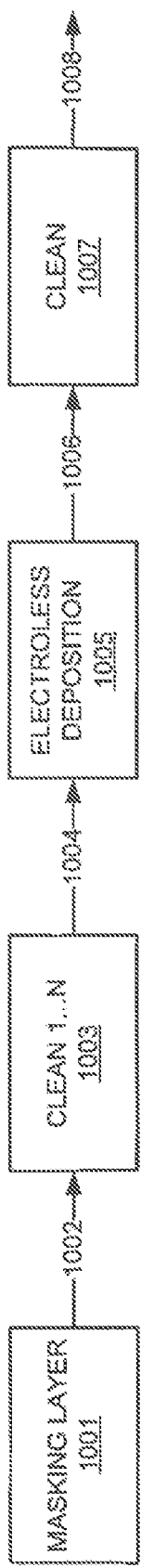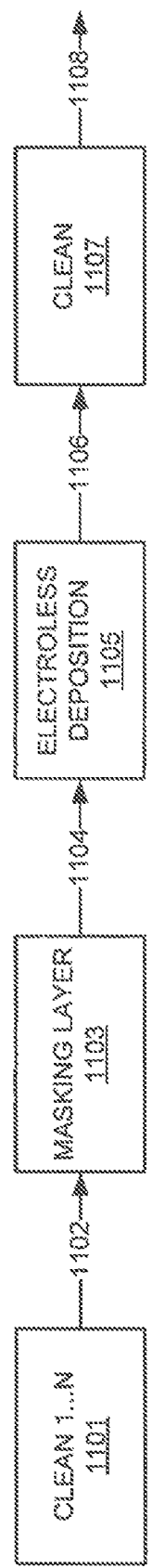

| Sample | Before masking layer | After masking layer |
|---|---|---|
| SiO2 | 21 - 25 | 50 - 54 |
| SiCNH | 38 - 42 | 48 - 52 |

CDF of pre and post leakage current for BKM eless with MML. (Squares = baseline of YB1; Triangles = baseline of YB5; Circles = baseline of YB9; Plus symbol = post-eless of YB1; Diamonds = post-eless of YB5; Minus symbols = post-eless of YB9)

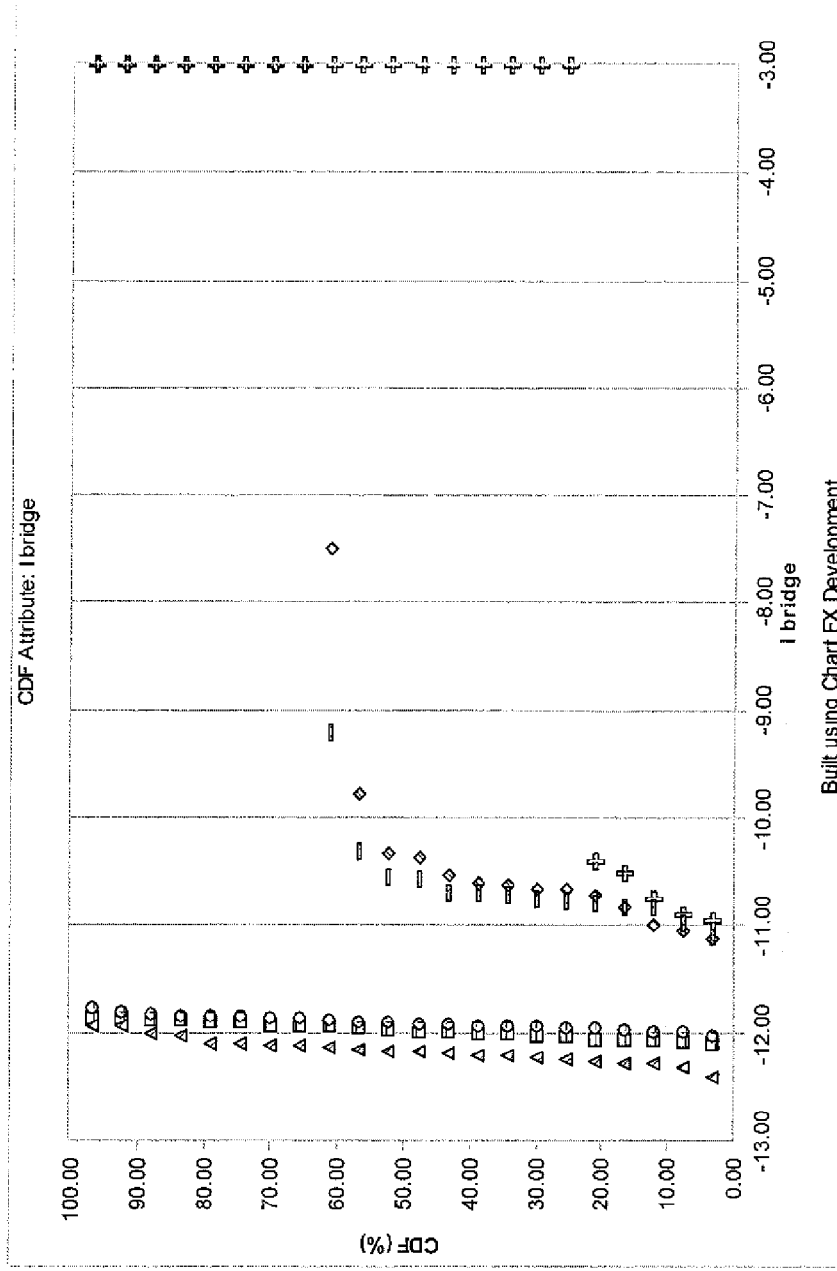

SUBSTRATE PROCESSING INCLUDING A MASKING LAYER

RELATED APPLICATIONS

This application is a divisional application of U.S. patent application Ser. No. 11/647,882 which is a continuation in part application of U.S. patent application Ser. No. 11/284,572, filed Nov. 22, 2005, which claims the benefit of U.S. Patent Application No. 60/630,485, filed Nov. 22, 2004 and also claims the benefit of U.S. Patent Application No. 60/832,055, filed Jul. 19, 2006.

TECHNICAL FIELD

This embodiments described herein relate to substrate processing and, more particularly, substrate processing that includes use of a masking layer.

BACKGROUND

In the manufacture of various products, electrically conductive material and dielectric material are formed on, in, or as part of, a silicon substrate such that regions of the electrically conductive material are separated by regions of dielectric material from other regions of the electrical conductive material to define electrical elements (e.g., transistors, capacitors, resistors) and electrical interconnections between electrical elements. Substrates including electrically conductive regions separated by a dielectric region are sometimes referred to herein as electronic devices. Electronic components such as microprocessors and memory chips for computers and other devices like flat panel displays are well-known examples of such products.

During operation of an electronic device, the flow of current through an electrical interconnection can cause electromigration which can result in deformation of the electrical interconnection, in particular at an interface with adjacent material. Electromigration is used herein to refer to the movement of atoms of an electrically conductive material as a result of current flow through the electrically conductive material. Such deformation can result in undesirable current leakage or current flow inhibition. As the characteristic dimension of electrical interconnections of electronic devices becomes smaller, the increased current density flowing through those electrical interconnections renders electromigration even more of a problem.

A semiconductor device is an electronic device in which the substrate comprises a semiconductor material or materials. The semiconductor device can include for example electrically conductive regions and dielectric regions formed over another electrically conductive region. The electrically conductive regions can be, for example, interconnections between the electrically conductive region and other electrically conductive material to be subsequently formed as part of the semiconductor device. In current semiconductor devices, copper is commonly used to form electrically conductive regions and a silicon dioxide-based material (e.g., FSG, SiCOH, porous SiCOH, MSQ, etc.) is commonly used to form dielectric regions. Additionally, in current semiconductor devices, the dielectric region often includes a hard mask layer (which is often formed of a silicon-based material (e.g., $SiC_x$, $SiN_x$, $SiC_xN_y$, where the variables x, y, and z represent values as appropriate to desired compositions) formed at a top portion of the dielectric region.

A semiconductor device can include a dielectric barrier layer that is a layer of dielectric material in a semiconductor or other electronic device formed non-selectively on both electrically conductive regions and dielectric regions that separate those electrically conductive regions, after planarization of the top of the electrically conductive regions and dielectric regions. The dielectric barrier layer is used to inhibit diffusion of material from the electrically conductive regions into adjacent regions (in particular, into the bulk dielectric material subsequently formed over the electrically conductive regions) of the semiconductor device.

In current semiconductor devices, compositions including silicon together with carbon and/or nitrogen (e.g., $SiC_x$, $SiN_x$, $SiC_xN_y$) are commonly used to form the dielectric barrier layer. Since these materials have a higher dielectric constant than the dielectric materials that could otherwise be used, an undesirable consequence of the presence of a dielectric barrier layer is that the capacitance associated with the device structure is increased, which can increase power consumption and/or decrease speed of operation of the semiconductor device. Further, conventional implementations of a dielectric barrier layer do not adhere well to conventional implementations of electrically conductive regions in semiconductor devices. Consequently, these conventional dielectric barrier layers do little to inhibit electromigration in the electrically conductive regions, which commonly is initiated at the interface between the electrically conductive regions and the dielectric barrier layer.

In view of the foregoing, there is a need for improved inhibition of electromigration in electrically conductive regions of semiconductor and other electronic devices and, in particular, at interfaces of electrically conductive regions with adjacent regions formed of other material. There is also a need for reduction in capacitance of the structure formed in the vicinity of the electrically conductive regions of semiconductor and other electronic devices, while adequately maintaining a barrier to diffusion of material from the electrically conductive regions into adjacent regions formed of other material. These needs have and will likely continue to become increasingly strong as the characteristic dimension of features in electronic devices becomes smaller.

To inhibit electromigration at the interface between electrically conductive regions and a dielectric barrier layer of a semiconductor device, a layer of material has been selectively formed on the electrically conductive regions before forming the dielectric barrier layer. Such a selectively formed layer can be referred to as, for example, a capping layer. Capping layers have been formed under conventional processes using various materials and processes. For example, a capping layer has been formed by selectively depositing an appropriate material on electrically conductive regions. A metallic material is often deposited by an electroless metallization process because this process can be catalyzed by the metallic regions of the surface, providing some inherent selectivity.

For instance, electroless deposition has been used to selectively deposit a metal alloy (e.g., an alloy of cobalt, tungsten and phosphorous; an alloy of cobalt and boron; or an alloy of nickel, molybdenum and phosphorous) on copper regions. An approach of this type is described in "High Reliability Cu Interconnection Utilizing a Low Contamination CoWP Capping Layer," by T. Ishigami et al., Proceedings of the 2004 IEEE International Interconnect Technology Conference, Jun. 7-9, 2004, pp. 75-77. Chemical vapor deposition has also been used to selectively deposit tungsten on copper regions. An approach of this type is described in "A Robust, Deep-Submicron Copper Interconnect Structure using Self-Aligned Metal Capping Method," by T. Saito et al., Proceedings of the 2004 IEEE International Interconnect Technology Conference, Jun. 7-9, 2004, pp. 36-38. However, the selectivity of these approaches is inadequate to inhibit formation of capping layer material (which is electrically conductive) on dielectric regions to an extent that prevents unacceptable current leakage between electrically conductive regions separated by those dielectric regions. This may be due, at least in part, to residual material from the electrically conductive regions that is left on the dielectric regions after planarization (e.g., chemical mechanical polishing (CMP)) of the exposed surfaces. This residual metallic contamination on the dielectric regions may provide nucleation sites for the capping layer material (which is chosen for its affinity for forming on the material of the electrically conductive regions). This can significantly reduce preferential formation of the capping layer material on the electrically conductive regions as compared to the dielectric regions.

A capping layer has also been formed under conventional processing by chemically modifying a top part of each of the electrically conductive regions. For example, a capping layer has been formed by chemically modifying the top parts of copper regions using silicidation and nitridation. An approach of this type is described in "Integration and performance of an alternative approach using copper silicide as a self-aligned barrier for 45 nm technology node Cu interconnects," by L. G. Gosset et al., Proceedings of the 2004 IEEE International Interconnect Technology Conference, Jun. 7-9, 2004, pp. 15-17. However, the capping layer formed in this way undesirably increases resistance in the electrically conductive regions.

It has also been proposed to form a capping layer of organic material on electrically conductive regions of a semiconductor device to inhibit electromigration at the surfaces of the electrically conductive regions. The use of organic material, which is a very poor electrical conductor, eliminates the potential for unacceptable current leakage between electrically conductive regions resulting from the presence of the capping layer, even if the processes and materials used to form the organic layer are not particularly selective in preferentially forming the organic layer on electrically conductive regions. U.S. Patent Application Publication Number US-2004-0203192-A1 describes such an approach in which a self-assembled organic monolayer (in particular, a thiolate self-assembled monolayer) is covalently bonded to metallic regions. However, it is believed that the thiolate self-assembled monolayers described therein may not produce, when formed on copper, a thermally stable capping layer that remains continuous and defect-free under operating conditions of the semiconductor device. Therefore, the capping layer formed in this manner may not adequately inhibit electromigration, or provide an adequate copper diffusion barrier that can enable elimination of the dielectric barrier layer from the semiconductor device.

Furthermore, it is becoming desirable to use porous dielectric materials in electronic devices (which may or may not have a hard mask layer formed thereon), particularly semiconductor devices used in the production of electronic components. A porous material, in this context a porous dielectric material, is particularly susceptible to diffusion of other material therein. For example, a dielectric region made of a porous dielectric material is particularly susceptible to diffusion therein of capping layer material; especially when the capping layer material is a metallic material, as is often the case, diffusion of capping layer material into a dielectric region increases the likelihood of unacceptable current leakage. Additionally, as described above, residual material from electrically conductive regions that is left on a dielectric region after planarization (e.g., chemical mechanical polishing) of the exposed surfaces of the electrically conductive regions and dielectric region can provide nucleation sites for the capping layer material, thus significantly reducing preferential formation of the capping layer material on the electrically conductive regions during formation of a capping layer. A dielectric region made of a porous dielectric material is particularly susceptible to diffusion therein of such residual material, thus exacerbating this problem. Consequently, there is a need for materials and processes that are compatible with a variety of substrates and functionalize or normalize the substrate for compatibility with subsequent processes typically applied to the substrate while reducing the effects of electromigration and diffusion.

BRIEF DESCRIPTION OF THE DRAWINGS

FIG. 7 is a block diagram of a masking layer process flow, under an embodiment.

FIG. 8 is a block diagram of a masking layer process flow, under an alternative embodiment.

FIG. 9 is a block diagram of a masking layer process flow, under another alternative embodiment.

FIG. 10 is a block diagram of a masking layer process flow, under yet another alternative embodiment.

FIG. 11 is a block diagram of a masking layer process flow, under still another alternative embodiment.

FIG. 16B shows a plot of leakage current versus cumulative distribution function (CDF) (%) of samples before and after conventional electroless cobalt deposition without the use of the masking layer.

DETAILED DESCRIPTION

Figure 1:
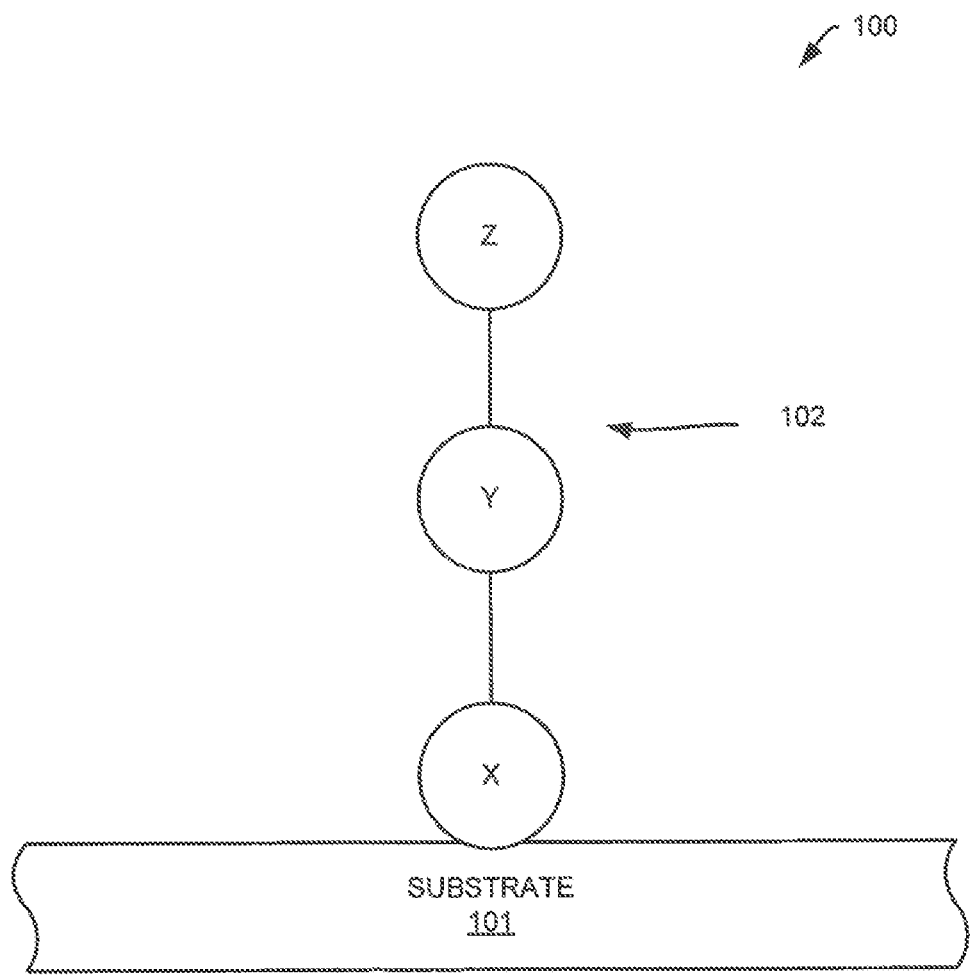
FIG. 1 is an example of a structure that includes a masking layer deposited on a portion of a substrate, under an embodiment.

Embodiments of a masking layer are described below along with processes corresponding to the masking layer. The masking layer, also referred to as a molecular masking layer (MML), can be formed using any combination of materials and/or processes that produce a masking layer configured to achieve desired functions (e.g., selective formation on a dielectric region, provision of a good barrier to diffusion of capping layer material, reducing adhesion of capping layer material, etc.). Thus, the masking layer is used in the processing of substrates comprising a variety of materials to functionalize or normalize one or more regions of the substrates to have desired properties.

In functionalizing or normalizing a substrate, constituents of the masking layer are compatible with the substrate as well as with chemistries of subsequent processing of the substrate. Consequently, the masking layer is configured to selectively favor formation on one or more particular materials (e.g., selectively forms on dielectric instead of copper surfaces), while the masking layer includes one or more types of constituent molecules that are compatible with or enhance the subsequent processing. Therefore, the masking layer does not have adverse affects on or lead to detrimental reactions with constituents of the substrate or processes applied to the substrate.

Functionalizing a material as used herein refers to modifying the characteristics of an exposed part of the material to achieve a desired interaction with another material or process subsequently formed on the exposed part of the material. Normalization of the substrate through use of the masking layer neutralizes regions or components of the substrate thereby ensuring compatibility with subsequent processes. The masking layer normalizes a substrate by conditioning at least a portion of the substrate so that subsequent processing (e.g., electroless deposition) can proceed without consideration to the constituents of the substrate. This allows for example a common process to be used with different generations or types of substrates because the substrate with the integrated masking layer provides a normalized surface to which the process is insensitive.

As industries like the semiconductor industry move to substrates comprising low-K materials, components of the low-K materials (e.g., —NH group) can adversely affect chemistries of subsequent substrate processing. Use of a masking layer of an embodiment, however, normalizes the substrate surfaces and provides a means for modifying the surface characteristics of the substrate as appropriate to subsequent processing of the particular substrate. The normalized substrate including the masking layer is effectively neutralized, and this reduces or eliminates poisoning of subsequent processing chemistries by molecular components of the substrate. The masking layer allows for normalization of the substrate, between or among different wafers, between or among different regions of the same wafer, and between or among different dielectric types. In addition the masking layer also provides control of chemical characteristics (e.g., wettability, zeta potential, metal binging affinity, adhesive properties, etc.) of the substrate so as to maintain the characteristics in an operable regime relative to the pre-specified subsequent processing. The chemical characteristics of the substrate can also be modulated as described herein according to subsequent processing.

The masking layer is used in the processing of a substrate made of any type(s) of material, for example, a silicon substrate, silicon-on-insulator substrate, silicon carbide substrate, strained silicon substrate, silicon germanium substrate or gallium arsenide substrate to name a few. More particularly, the masking layer is used with conventional silicon oxide substrates (e.g., $SiO_2$) as well as with low-K substrates (e.g., substrates comprising materials having a low dielectric constant (K), and also referred to as low-K barrier substrates or low-K materials) (e.g., $SiC_xN_yH_z$ and $SiC_xO_yH_z$, where each of X, Y, and Z represents or includes any rational number).

The embodiments can be used in processing or fabricating electronic devices including substrates that include electrically conductive regions and dielectric regions of any type of material. In semiconductor devices used in the production of electronic components, for example, the electrically conductive regions are often made of copper or aluminum; the embodiments can readily be used in processing such substrates. A variety of dielectric materials (e.g., SiCOH dielectric materials, including porous SiCOH dielectric materials, etc.) are used to form dielectric regions of semiconductor devices used in the production of electronic components and the embodiments are compatible for use with these dielectrics. In many semiconductor devices, a hard mask layer (which is often formed of a silicon-based material, e.g., $SiC_x$, $SiN_x$, $SiC_xN_y$, etc.) is formed on top of a dielectric material of which the dielectric region is primarily composed; the embodiments can also readily be used in the production of an electronic device using such substrates.

Further, the embodiments can be used in the processing of a substrate of any shape or size. For example, the embodiments can be used in the processing of semiconductor substrates used in the production or fabrication of electronic components, which substrates are typically circular, as well as in the processing of substrates used in the production of flat panel displays, which substrates are typically rectangular. The embodiments can be used in the processing of small semiconductor substrates having areas of less than one (1) square inch (in) up to the 12 inch (300 mm) semiconductor substrates currently used in the production of many electronic components; in general, there is no limit to the size of substrate that can be processed, so that the embodiments can be used to process each succeeding larger generation of semiconductor substrates used to produce electronic components. The embodiments can also be used to process the relatively large substrates that are used in the production of flat panel displays (now, commonly rectangular substrates on the order of about one (1) square meter (m), but, in some cases, larger, and expected to increase in size in the future). The embodiments can also be scaled for use in roll-to-roll processing applications for flexible substrates having a fixed width, but (theoretically) unlimited length (a manner of substrate processing that can be particularly useful in the production of flat panel displays); for example, such substrate rolls can be hundreds of feet long. The masking layer can be used in fabrication that includes front-end-of-the-line (FEOL), which is the first portion of integrated circuit (IC) fabrication wherein devices are patterned in a semiconductor. The masking layer can also be used in fabrication that includes back-end-of-the-line (BEOL), which is the portion of IC fabrication in which active components are interconnected with wiring on a wafer.

The masking layer of an embodiment can be formed as a monolayer, submonolayer, or a multilayer using a number of different materials and/or processes as appropriate to an application of the substrate that includes the masking layer or processes applied to the substrate. As an example, the masking layer is a sub-monolayer on the substrate surface. A sub-monolayer is defined as a molecularly self-assembled layer in which the molecules comprising the layer are not densely packed but rather dispersed across the surface. Sub-monolayers are effective in modulating the macroscopic and microscopic chemical properties of the surface such as wettability (contact angle), adhesive properties, zeta potential, and metal binding ability to name a few. These changes can have dramatic effects on subsequent processing of the substrate. An additional mode of action of sub-monolayers may include, but is not limited to, blocking reactive sites on the dielectric surface (amines, alcohols, isolated silanols, vicinal silanols, geminal silanols, etc.).

The masking layer can be formed using either wet processing or dry processing. The masking layer can be selectively applied to regions or portions of a substrate (e.g., dielectric layer or conductor); likewise, the masking layer can be selectively removed from portions of a substrate. Also, the masking layer can be removed following completion of a subsequent deposition process, thereby improving selectivity by removing particles from the underlying substrate; masking layer removal can be complete (entire molecule removed), or partial (built-in cleavable group allows for removal of a portion of the masking layer molecule). Furthermore, the masking layer can proactively dissuade particle formation by using a terminal group that repels particles. The masking layer can also be configured to have a thickness so that, during subsequent processing, the masking layer is constantly being removed or consumed; therefore, the masking layer may not remain intact throughout subsequent processing of the substrate. Additionally, the making layer can be modulated by one or more of a wet and dry chemical process to optimize the surface characteristics for the capping layer application.

Use of the masking layer in substrate processing enhances manufacturability because it minimizes any adverse affects introduced into the substrate processing as a result of discrepancies in the surface state between one or more of different regions of a substrate, different substrates of a lot, and different material lots. The masking layer integration also enhances manufacturability because it eliminates processing issues that arise from discrepancies in the surface states of substrates introduced through the use of different tools and/or different processes (chemistries) by different fabrication facilities. Additionally, as described above, the masking layer can be configured to facilitate one or more particular processes or chemistries to which the substrate will be subjected during subsequent processing (e.g., masking layer can be configured or tailored to facilitate wetting during subsequent wet processing like processes that involve selective deposition of metal).

The masking layer of an embodiment includes three (3) functional groups or moieties (also referred to herein as sites), but is not limited to three sites. FIG. 1 is an example of a structure 100 that includes a masking layer 102 deposited on a portion of a substrate 101, under an embodiment. The masking layer 102 comprises three sites X, Y, and Z, but is not so limited. The three sites of the masking layer are referred to herein generally as the X site, the Y site, and the Z site because any of a variety of molecules or functional groups can form one or more of these sites depending upon the desired configuration and purpose of the masking layer. More specifically, the X site is referred to herein as the binding group, the Y site is referred to herein as the linking group, and the Z site is referred to herein as the terminal group. Each of the components of the masking layer is further described below.

The X site of the masking layer is configured as the bonding site to the substrate. The X site is configured (e.g., kinetics) to bond to a substrate (e.g., dielectric substrates, $SiO_2$, $SiC_xN_yH_z$, $SiC_xO_yH_z$, etc.) and provide a fast deposition rate on the substrate for rapid masking layer deployment while also providing selectivity. The X site is also configured so as not to have an adverse reaction with other materials or compositions that may be present in the substrate processing (e.g., Cu, CuO, $CuO_2$, etc.).

Examples of molecules that function as the X site in the masking layer of various embodiments include $R'_{4-n}Si-(NR_2)_n$, $R'_{4-n}Si-Cl_n$, and $R'_{4-n}Si-(OR)_n$, $R'_{4-n}Si-(OH)_n$ but are not so limited. The variable R in these X site molecules represents molecules of the same or different aliphatic groups, and the variable n represents any integer having a value in the range of one (1) to three (3) (e.g., a monofunctional silane includes the molecules with n=1, a difunctional silane includes the molecules with n=2, and a trifunctional silane includes the molecules with n=3). As examples, the variable R can represent methyl groups, ethyl groups, methyl-ethyl (isopropyl) groups, butyl groups, and various combinations of methyl groups, ethyl groups, methyl-ethyl (isopropyl) groups, butyl groups, but is not limited to these groups or combinations of these groups. R' represents similar or different groups that dictate the surface chemistry of the resulting surface.

The $R'_{n-4}Si-(NR_2)_n$ site provides a high deposition rate on the substrate relative to the $R'_{4-n}Si-(OR)_n$ site, and does not corrode copper. Each $(NR_2)$ site serves as a potential bonding or lateral crosslinking site, so a relatively high deposition rate and relatively dense coverage can be achieved with a larger number of binding sites (e.g., $R'Si-(NR_2)_3$).

Another example of a molecule that functions as the X site in the masking layer of an embodiment includes $R'_{4-n}Si-Cl_n$ which is highly reactive with water and provides a relatively higher deposition rate. However, the $R'_{4-n}Si-Cl_n$ site is not chemically compatible with many other materials that comprise the substrate (e.g., erodes or corrodes copper).

The Y site of the masking layer is configured to serve as a link between the X site and the Z site. The linking of the Y site can be cleavable so that the Y site can be cleaved entirely or partially during one or more subsequent processes. For example, the cleavable Y site can be cleaved during or following subsequent processes in order to remove one or more particular types of molecule of subsequent processes captured by molecules of the Z site and/or the Y site.

The Y site of an embodiment is configured to protect the X site, thereby enhancing the survival rate of the X site. When configured to protect, the Y site protects or enhances the survival rate of the bonds between the X site and the substrate. An example is that the Y site can be configured to have hydrophobic characteristics or steric hindrance so as to repel or block aggressive aqueous solutions of subsequent processing, thereby protecting the X site and substrate from the destructive effects of these solvents.

The Y site of an embodiment can be configured as a polymerization site to crosslink molecules of the masking layer to improve the survival rate. The survival rate of the masking layer depends on the number of bonds and increases as the number of bonds increases. For example, use of a very harsh electroless deposition process might dictate more crosslinking via the Y site, where a less aggressive electroless deposition process would require less crosslinking with the Y site. Also, the length of the linker comprising of the Y site relates to survivability, so length of the linker is also configured according to the survivability required during any subsequent substrate processing.

The Z site of the masking layer is configured to determine the compatibility (e.g., wetting angle or wetting contact angle, specific or nonspecific adhesion characteristics, chemical processes, etc.) of the masking layer to the subsequent processes applied to the substrate with the integrated masking layer. The compatibility includes compatibility between the Z site molecules and the chemistry used in subsequent processes applied to the masking layer in order to avoid poisoning of subsequent process chemistry. Compatibility as used herein includes compatibility with particular molecules, compositions, and/or processes. Furthermore, compatibility as used herein includes relatively increased selectivity to particular molecules, compositions, and/or processes, and also includes relatively increased repulsion of particular molecules, compositions, and/or processes. For example, compatibility includes selectivity of attraction to or repulsion of particular molecules, compositions, and/or processes as appropriate to the desired function of the masking layer.

For example, when the subsequent processing is electroless metalization, the Z site is configured to include molecules that are compatible with copper and cobalt ions, atoms, or nanoparticles. Also, if the Z site were not compatible with copper and cobalt, the copper and cobalt atoms might bond directly with the Z site if site or material had more affinity for copper/cobalt, compared to the conducting region. In this case compatibility refers to the ability of the MML to repel or not to bind metals. In general, the Z site should be process compatible while not interacting with the capping process. As described above, the Z site of an embodiment can serve as a site for polymerization or crosslinking, where the selective transformation is used to modulate the final surface of the masking layer to achieve the desired functionality of the final surface for example.

Figure 2:
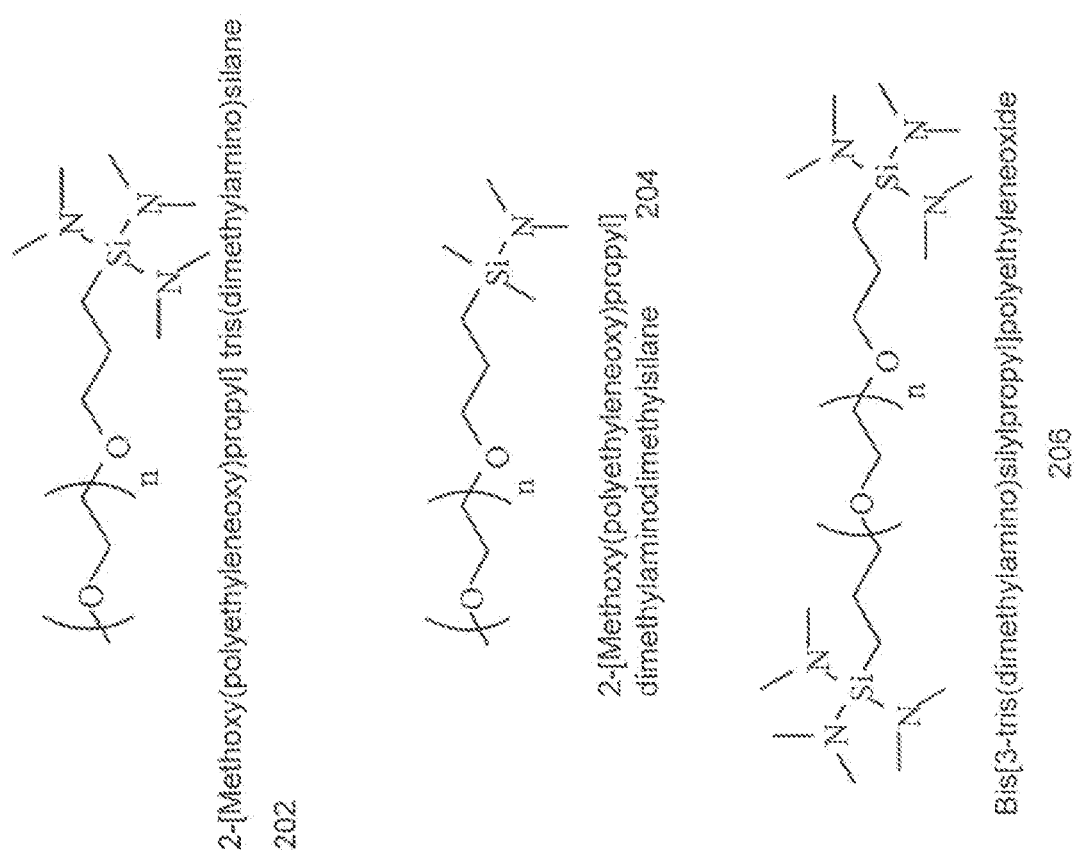
FIG. 2 shows example masking layers, under an embodiment.

FIG. 2 shows example masking layers 202-206, under an embodiment. One example masking layer is 2-[Methoxy (polyethyleneoxy)propyl]tris(dimethylamino)silane 202. The masking layer 202 (where variable n is approximately in a range of 6 to 9) has been used to demonstrate improvement in leakage current on TEOS Oxide wafers (e.g., TEOS Oxide wafers include substrates processed using Tetraethyl Orthosilicate ($Si(OC_2H_5)_4$), which is a gaseous compound used in chemical vapor deposition (CVD) processing of $SiO_2$). The masking layer 202 has also been used to demonstrate dramatic reduction of particle presence on SiCN.

Another masking layer example is 2-[Methoxy(polyethyleneoxy)propyl]dimethylaminodimethylsilane 204. Additionally, Bis[3-tris(dimethylamino)silylpropyl]polyethyleneoxide 206 is a further masking layer example. The three example masking layers 202-206 are shown only as examples of the masking layers described herein and are not intended to limit the masking layer to these examples. Further masking layer examples may include analogs (various values of n) as well as bipodal silanes (containing more than one functional silicon atom) in addition to the example MMLs 202-206 described above.

The preferred surface functionality for reduced particle adhesion/nucleation consists of poly or oligo ethylene oxide. This functionality for the terminal group or Z was arrived at by testing a broad variety of terminal or Z groups. It was found that poly or oligo ethylene oxide exhibits superior performance relative to many other functional groups. This is likely due to a relatively low water contact angle, lack of reactive functionality, and compatibility with the surface and processing steps. The chemistry of this layer may be fine tuned by adjusting the length of the poly or oligo ethylene oxide chain as well as the identity of the terminal group, methyl, hydroxyl, or other. This same terminal or Z group can be deposited on the surface under different conditions by varying the identity of the binding or X group. For example when the binding group is composed of a tris(dimethyamino) silane deposition occurs from toluene or organic solvents. When the binding group is composed of a trihydroxy, trimethoxy, or mixed methoxy/hydroxysilane deposition can occur from water or aqueous solutions.

The masking layer of an embodiment provides substrate-selective attachment to the substrate. This allows the substrate with the integrated masking layer to present a different functional group or molecule (referred to herein as a site) (e.g., Z site) to one or more subsequent processes as a reactive site for the polymerization, as described in detail herein. The selectivity includes, for example, use of one functional group (e.g., X site) to selectively bond to the substrate and use of a different functional group (e.g., Z site) to serve as a reactive site selectively favoring a particular subsequent process. In selective polymerization, therefore, the masking layer patterns itself via selectivity to one or more regions of the dielectric and selectivity of one or more regions of the masking layer surface (e.g., Z site) to subsequent processes. Additionally, the Y site can be bonded to one, two, or three X sites to increase the kinetic deposition rate of masking layer deposition, and the multiple bonds between X sites and substrates can enhance the survival rate. However, the number of bonds between X sites should be optimized according to the masking layer removal after capping layer deposition. Additionally, a number of Z sites is not limited to one Z site. A Y site can have bonds to numerous Z sites, and the number of Z sites is determined according to the capping process, such as wetting angle or capping layer enhancement.

Generally, with reference to FIG. 1, the masking layer includes a binding group X formed on or bonded to the surface of the substrate, a linking group Y connected to the binding group X, and a terminal group Z, connected to the linking group Y, on which material can subsequently be formed. The linking group Y is configured to protect the bond between the binding group X and the substrate, or to be cleaved. The terminal group Z is configured for compatibility with one or more subsequent processes. Without modification, the masking layer X-Y-Z has characteristic(s), with respect to formation of material on the electronic device subsequent to formation of the masking layer, in accordance with the nature of the terminal group Z used in the masking layer X-Y-Z. Additionally, terminal group Z can be modified by dry plasma, UV radiation, electron beam (ebeam), and/or laser treatment to further modulate the Z functionality to accommodate the dynamic need of capping layer processes. There are multiple steps in the capping process, and the Z group can be in-situ modified such that it has optimal characteristics for each step.

Figure 3:
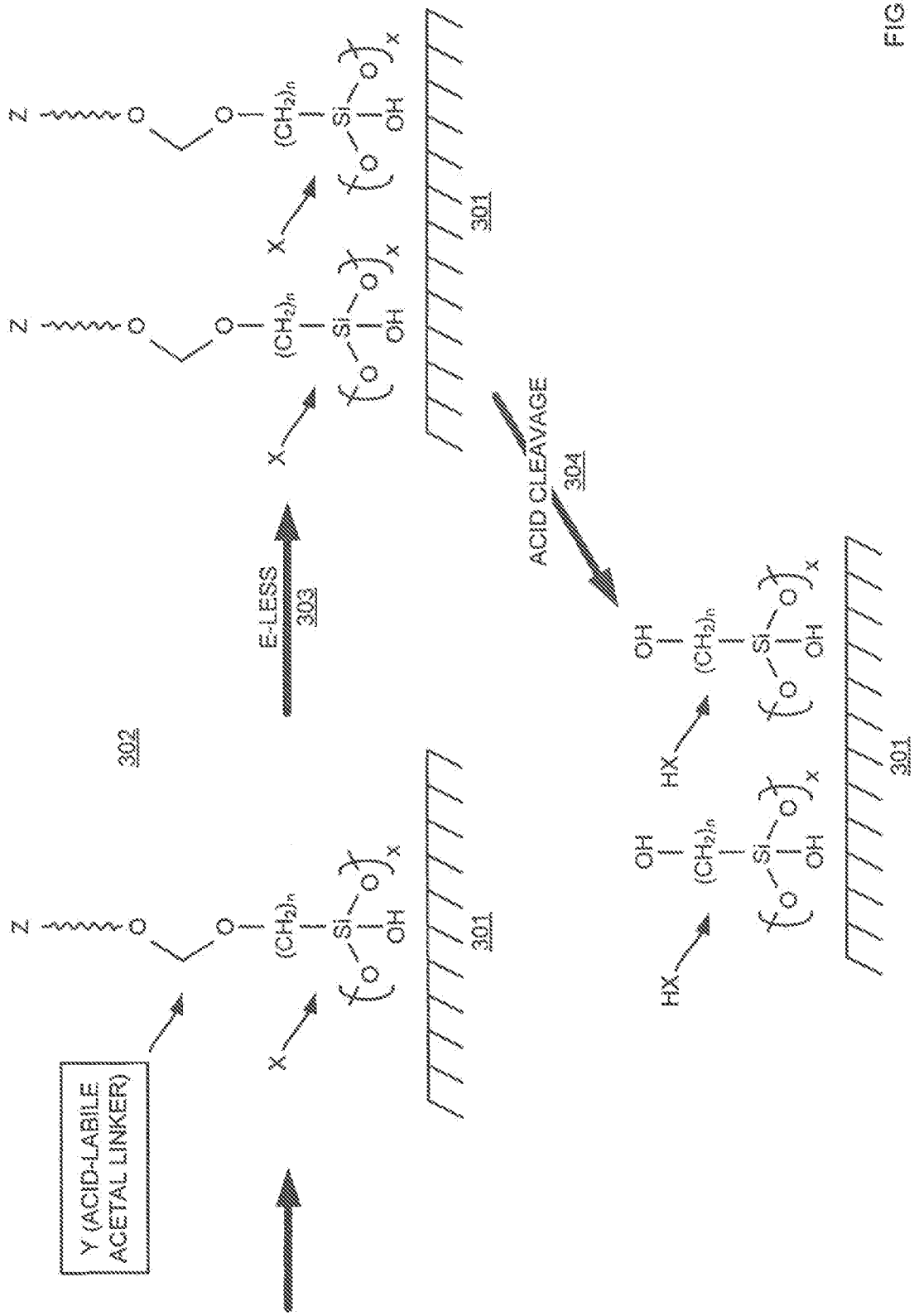
FIG. 3 is an example of a structure that includes a masking layer on a portion of substrate, under an embodiment.

FIG. 3 is an example of a structure that includes a masking layer 302 on a portion of substrate 301, under an embodiment. The masking layer 302 of this example is a self-assembled monolayer (SAM) but the embodiments herein are not limited to SAMs. The masking layer 302 includes a head group X, a linking group Y (e.g., acid-labile acetal linker), and terminal group Z formed on a portion of a substrate. After formation of the masking layer 302, the masking layer can be functionalized or otherwise modified (e.g., chemically, thermally and/or photo-chemically modified) in a desired manner to produce desired properties (e.g., to produce a desired propensity for formation on the masking layer of material to subsequently be formed on the electronic device, such as a capping layer or a dielectric barrier layer, or to enable some or all of the masking layer to be removed after formation of the capping layer so that capping layer material formed on the masking layer can be removed). The substrate 301 with the integrated masking layer 302 undergoes electroless deposition 303 (E-less) following formation of the masking layer 302.

In this example, upon completion of the electroless deposition 303, an acid is used to cleave 304 the linking group Y from the head group X, leaving the hydrolyzed head group X HX on the portion of the substrate. Therefore, the linking group Y of the masking layer X-Y-Z is cleaved, removing part of the linking group Y and the entire terminal group Z of the masking layer; the part of the linking group Y remaining on the portion of the substrate provides the desired characteristic(s) for the masking layer. Alternatively, the cleaving can occur during or as a component of the electroless deposition 303. Cleaving of the masking layer allows a portion of the linking group Y to be dissociated in a controllable manner from the cleavable site to release the top portion of the masking layer. The top portion of the masking layer released can therefore serve, for example, as a capture device to capture or trap undesirable particles that might form as a result of capping layer deposition. The remaining portion of the linking group Y remaining following the cleaving process can be converted (e.g., chemically, thermally, or a combination of chemically and thermally) to form a desired hard mask layer to protect the low k dielectric without damaging the k value.

The masking layer of an alternative embodiment includes compositions that are not SAMs. As one example, the masking layer includes an oligomer layer configured to be consumed during subsequent electroless deposition. The masking layer of this embodiment includes a head group X to bond to the surface of the substrate, a linking group Y connected to the head group X, and a terminal group Z, connected to the linking group Y, that provides chemical or process compatibility with subsequent processes or chemistries (e.g., a polymerization site). The linking group Y is configured to provide a reactive site for crosslinking or cleave sites.

Figure 4:
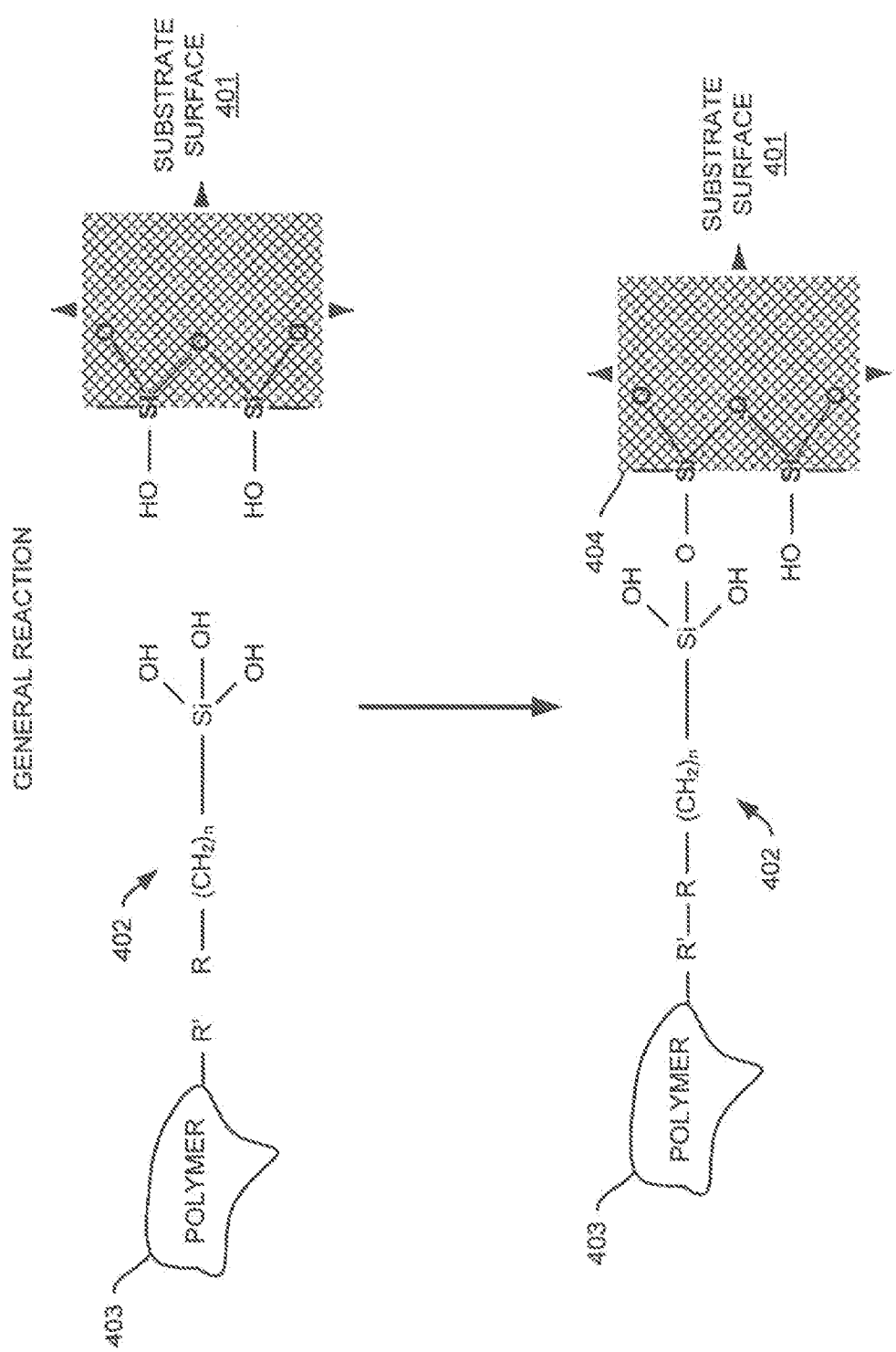
FIG. 4 is an example of a masking layer including an oligomer layer, under an embodiment.

FIG. 4 is an example of a masking layer 402 including an oligomer layer 403, under an embodiment. There is a reactive site included in the masking layer which can be used to form a selectively bonding with a soluble oligomer/polymer to modify the surface characteristic, or to increase the masking layer survival capability from the subsequent Eless process. Additionally, the oligomer can be designed to enhance the capping layer deposition. The masking layer 402 includes a head group X (e.g., $Si(OH)_3$), a linking group Y (e.g., $(CH_2)_n$), and terminal group Z (e.g., $O(C_2H_4O)_nCH_3$) formed on a portion of a substrate 401. The general reaction includes bond formation between the head group X of the masking layer 402 and the substrate surface 401, and bond formation between the terminal group Z and the oligomer 403. The resultant material on the substrate 401 comprises the masking layer 402 and oligomer layer 403.

Prior to forming a masking layer the exposed surfaces of the electrically conductive regions and the exposed surface of the dielectric region are prepared for processing. This surface preparation includes at least one or more cleaning steps to remove contaminants remaining from previous processing. As an example, a deionized (DI) water rinse and/or any of a variety of other known surface cleaning processes can be used. Such cleaning may remove some, but typically would not remove all, residual electrically conductive material left on a dielectric region after planarization of the exposed surfaces of the electrically conductive regions and dielectric region. The cleaning does not, therefore, negate the efficacy of the embodiments described herein in preventing such residual electrically conductive material from promoting undesired nucleation of capping layer material on the dielectric region.

The surface preparation can include other processes or combinations of processes as well. For example, the exposed surfaces of the dielectric region can be functionalized to facilitate selective formation of the masking layer. In particular, the surface of the dielectric region can be functionalized to promote formation of the masking layer and the exposed surfaces of the electrically conductive regions can be functionalized to inhibit formation of the masking layer.

In general, the particular manner in which the surfaces of the electrically conductive regions and/or the surface of the dielectric region are functionalized depends on the nature of the materials used to form the electrically conductive regions, the dielectric region and the masking layer, and the desired property or properties (e.g., passivation, promotion of material formation) to be produced. For example, a dielectric region formed of a silicon dioxide-based dielectric material can be functionalized to produce a large number of hydroxyl groups at the surface of the dielectric region, to which a self-assembled monolayer (which can embody the masking layer) has an affinity for attachment, thus promoting formation of the masking layer on the dielectric region. Additionally, a molecule used to form a molecularly self-assembled layer can be established to include a head group that covalently bonds with an exposed hydroxyl group of the material used to form a dielectric region.

The masking layer can be formed on the dielectric regions of the cleaned substrate using any material and/or process that produces or generates a masking layer that achieves desired functions of the masking layer, as described herein. The masking layer can be formed using either wet processing or dry processing (e.g., vapor deposition). The wet processing includes, for example, immersion of a substrate in a chemical bath, spraying or spinning of chemical fluid on to a substrate, to name a few. If wet processing is used, typically a rinsing process is used afterwards to clean the electronic device, which is then followed by a drying process. Additionally, if wet processing is used, vibration of specified amplitude and/or frequency (e.g., high frequency vibration, such as ultrasonic or megasonic vibration) can be imparted to the electronic device during the processing to facilitate the processing. The masking layer can also be formed by stamping. The masking layer can be formed of electrically non-conductive material, electrically conductive material, and/or semiconductor material.

The masking layer of an embodiment is formed using either organic or aqueous solvents. Further, the masking layer is compatible with an aqueous phase of subsequent processes (e.g., wet processing). Aqueous process conditions for masking layer formation generally include dissolving an organic silane (—Cl, —$NR_2$, or —OR) precursor in water so as to hydrolyze the silane and generate an aqueous hydroxy silane. The final hydrolyzed solution likely includes a mixture of monomeric trihydroxysilanes and oligomeric hydroxyl bearing silsesquioxanes that can also act as masking layer precursors. A masking layer can also be formed on a substrate through reaction in a solvent medium (e.g., water, toluene, anisole, PGMEA, ethyl lactate, glyme, diglyme, hexane, dichloromethane, etc.). The masking layer can be made to be stable to aqueous solvent media over a range of pH conditions. This allows for, using one subsequent process as an example, electroless deposition of capping layer material while maintaining the integrity of the masking layer. Removal of the masking layer can then be accomplished through treatment with an aqueous or mixed organic/aqueous solution at elevated temperature and pH (e.g., —$NaOH/MeOH/H_2O$ at pH 12). Thus, the adhesion properties of the masking layer can be controlled to facilitate attachment to a dielectric region, then removal from the dielectric region after formation of the capping layer.

One issue associated with substrate processing is how to control polarity or effect deposition of more polar molecules. Regarding solvent effects, the masking layer provides for modulation of masking layer deposition characteristics by modulating the polarity of the solvent. Species that promote wetting tend to be more polar (e.g., water has high polarity; toluene has low polarity); therefore, less polar solvents can be used to increase masking layer deposition. Consequently, solvent polarity is selected to modulate growth or deposition of a more polar masking layer. The solvent chemistry of masking layer deposition is used to further tune the masking layer because, for example, deployment of the masking layer depends upon the polarity and/or density of the solvent used during deposition processes. Therefore, solvent effects on masking layer deployment allow for use of solvent properties (e.g., polarity) to adjust or modulate the properties of the masking layer. Solvent effects on masking layer deployment include a masking layer deposition rate that increases as the dielectric constant of the solvent decreases. Furthermore, a depth or thickness of the masking layer increases as the polarity of the solvent decrease.

The masking layer can be, as described above, a molecularly self-assembled layer, which can be formed as a monolayer (SAM), a sub-monolayer, or a multilayer, and can be formed of organic and/or inorganic material. A molecularly self-assembled layer can be produced by forming (e.g., depositing or growing) additional material on the surface of the dielectric region, or by chemically activating or modifying the material of the dielectric region to produce a new distinct layer of material. The ability to tailor the molecule type, binding group, terminal group and/or chain length of a molecularly self-assembled layer provides flexibility in establishing the characteristics of a masking layer, which can be used to produce desired masking layer properties, as discussed elsewhere herein.

The masking layer can also be, for example, a layer formed from any class of materials known to form with controlled film thickness, such as for instance, multi-layer polyelectrolytes. The masking layer can also be, for example, a layer formed on the surface of the dielectric region through the catalytic growth of inorganic or organic materials. One example of this approach is the growth of polymer brushes from surface-initiated polymerization reactions. The surface initiators can be present in the material of the dielectric region or attached to the surface of the dielectric region through chemical or physioadsorptive means. The masking layer can also be, for example, a layer formed from dendrimers, hyper-branched polymers, and/or block co-polymers. The masking layer can also be, for example, an ionic or electrochemically-enhanced self-assembled multilayer or monolayer.

Silane-based materials can be used to form a masking layer in embodiments described herein. For example, some silane-based SAMs have relatively high breakdown temperatures, which may be desirable if the masking layer is not removed by subsequent processing of the electronic device, so that the masking layer will not experience failure during operation of the electronic device that produces high temperatures in the electronic device. Additionally, some silane-based SAMs adhere well to (form strong covalent bonds with) silicon-based dielectric materials (of which the dielectric region is commonly formed) and do not adhere well to metallic materials such as copper (of which the electrically conductive regions are commonly formed), which can make them desirable for use in some applications because they facilitate the selective formation of the masking layer. Further, silane-based SAMs can be tailored to facilitate removal of the SAM from a dielectric region, which can be useful in embodiments in which the masking layer is removed from the dielectric region. Additionally, silane-based SAMs can be tailored to promote or inhibit the formation of particular material thereon, which can be useful in inhibiting formation of capping layer material on a masking layer and/or promoting adhesion of a dielectric barrier layer formed on a masking layer.

The characteristics of a masking layer formed in an embodiment can be established to produce desired properties of the masking layer. For example, the type of molecule(s) used to form a molecularly self-assembled layer can be chosen, and the characteristics of the molecule, such as the binding group, terminal group and/or length (e.g., the number of carbon atoms in the organic backbone of a molecule), can be established, to produce desired properties of the molecularly self-assembled layer. The particular manner in which the characteristics of a masking layer are tailored can depend on the particular application of the embodiments, the necessity or desirability of avoiding formation of masking layer material on the electrically conductive regions, the characteristics of the materials and/or processes used to form the capping layer (e.g., the propensity of the capping layer material for formation on, and/or diffusion into, the masking layer), and/or the characteristics of the materials and/or processes used to subsequently form material on the masking layer.

For example, the materials and/or processes used to form the masking layer can be established to facilitate achievement of one or more of the following possibly desirable properties of a masking layer produced by a method, or part of a structure, in accordance with an embodiment. It can be desirable to use materials and/or processes that produce a masking layer with high selectivity for the dielectric region (i.e., that form better on the dielectric region than on the electrically conductive regions). In some electronic devices, a SiCOH dielectric material is used; consequently, in some embodiments, it can be desirable to use materials and/or processes that can be used to form a masking layer with high selectivity for a SiCOH dielectric material. In some electronic devices, a silicon-based hard mask layer is formed on top of a dielectric material of which the dielectric region is primarily composed; consequently, some embodiments include use of materials and/or processes that can be used to form a masking layer with high selectivity for a silicon-based hard mask layer.

Furthermore, it can be desirable to use materials and/or processes that produce a masking layer that can adhere well to a dielectric barrier layer (commonly formed of a composition including silicon together with carbon and/or nitrogen, i.e., $SiC_x$, $SiN_x$, $SiC_xN_y$) or other material to be subsequently formed on the masking layer. It can also be desirable to use materials and/or processes that produce a masking layer that provides a good barrier to diffusion/adhesion of the capping layer material (e.g., a cobalt alloy, such as a cobalt-tungsten-phosphorous-boron alloy), during production of the capping layer, post capping layer cleans, and during operation of the finished electronic device (if the masking layer is left as part of the finished electronic device). Additionally, it can be desirable to use materials and/or processes that produce a masking layer that facilitates removal of some or all of the masking layer (and, with it, any capping layer material that may have been formed thereon), e.g., that produce a terminal group of a molecularly self-assembled layer that can be cleaved from the rest of the molecularly self-assembled layer or that produce an organic backbone of a molecularly self-assembled layer that can be broken down and removed.

Further, it can be desirable to use materials and/or processes that can produce a masking layer that is continuous and defect-free and that, if to be left as part of the electronic device, remains so even when subjected to the thermal and chemical environment associated with further processing to produce the electronic device and/or operation of the finished electronic device. Therefore, the masking layer should be chemically compatible with the materials and processes used to produce the capping layer and (if present) the dielectric barrier layer. It can also be desirable to use materials and/or processes that enable rapid (e.g., less than about 60 seconds) production of a masking layer.

The characteristics of the masking layer can be established to produce desired material formation properties with respect to the dielectric region and the electrically conductive regions. For example, the characteristics of the masking layer can be established so that the masking layer forms selectively on the dielectric region in preference for formation on the electrically conductive regions. However, embodiments can also be implemented so that the formation of the masking layer is not selective; in that case, masking layer material formed on electrically conductive regions can be removed in a subsequent processing step, as described further below. In this regard, the embodiments can take advantage of the fact that, for some materials used to form electrically conductive regions on an electronic device (e.g., copper), few materials adhere well to the electrically conductive regions, providing greater flexibility in selecting materials and/or processes for selectively forming the masking layer. Additionally or alternatively the characteristics of the masking layer can also be established to facilitate removal of the masking layer from the dielectric region after formation of the capping layer.

For example, the molecule used to form a molecularly self-assembled masking layer can be specified to include a binding group that is more likely to adhere to the dielectric region than to the electrically conductive regions. For instance, a molecule used to form a molecularly self-assembled layer can be specified to include a binding group that covalently bonds with an exposed hydroxyl group of the dielectric region. As discussed above, some silane-based SAMs adhere well to silicon-based dielectric materials commonly used to form a dielectric region and do not adhere well to metallic materials such as copper that are commonly used to form electrically conductive regions, thus making them appropriate for use in embodiments in which the masking layer is selectively formed on the dielectric region. For example, it is known that a silane with one or more hydrolysable substituents of the general formula $R_nSiX_{4-n}$ (where R can be, for example, alkyl, substituted alkyl, aryl or substituted aryl, and X can be, for example, halo, alkoxy, aryloxy or amino) can form a SAM that can exhibit strong covalent or non-covalent attachment to particular surfaces. Typically, SAM surface attachment is enhanced on a surface having a relatively high density of acidic functionalities such as hydroxyl or hydroxysilyl groups. Silicon-based material surfaces such as $SiO_2$, SiOH and SiOC surfaces possess relatively high densities of hydroxyl groups. Thus, a silane-based SAM can be expected to form with greater adhesion to a surface of a silicon-based material (of which a dielectric region is commonly formed) than to a surface of a metallic material (of which electrically conductive regions are commonly formed).

A silane-based SAM can also be tailored to reversibly adhere to a surface depending on the nature and substitution of a silane precursor material. For example, silicon-based SAM precursors with a single hydrolysable substituent (e.g., of the general formula $R^1R^2R^3SiX$) are known to produce a SAM that can be formed on, and reversibly detached from, a functionalized surface (e.g., a surface having a relatively high density of acidic functionalities) under specific reaction conditions. For instance, a SAM can be formed on a substrate through reaction in an organic solvent medium (e.g., toluene, hexane, dichloromethane or mixtures thereof). Such a SAM can be made to be stable to aqueous solvent media over a range of pH conditions. This would allow, for example, subsequent electroless deposition of capping layer material while maintaining the integrity of the SAM. Removal of the SAM can then be accomplished through treatment with an aqueous or mixed organic/aqueous solution, and the adhesion properties of a silane-based SAM can be controlled to facilitate attachment to a dielectric region, then removal from the dielectric region after formation of the capping layer as described above. Silanization of surfaces is discussed for example in "Silanes, Surfaces and Interfaces (Chemically_Modified Surfaces, Vol. 1)," edited by Donald E. Leyden, Gordon & Breach Science Publishers, 1986, the disclosure of which is hereby incorporated by reference herein; principles discussed therein can be used in implementing embodiments, as can be appreciated in view of the description elsewhere herein of the use of silane-based materials.

The characteristics of the masking layer can also be established to produce desired material formation and/or adhesion properties with respect to material to be formed on the electronic device subsequent to formation of the masking layer. In particular, the characteristics of the masking layer can be established so that capping layer material does not form well on the masking layer, thus facilitating selective formation of the capping layer on the electrically conductive regions. However, the embodiments can also be implemented so that the formation of the capping layer is not selective; in that case, capping layer material formed on the masking layer can be removed in subsequent processing, and the desirability of establishing the characteristics of the masking layer to inhibit formation of capping layer material on the masking layer is generally diminished. The characteristics of the masking layer can also be established so that dielectric barrier layer material (if a dielectric barrier layer is present or to be formed) adheres well to the masking layer.

The process for applying or depositing the masking layer to a substrate surface can vary depending on a variety of factors relating to the substrate. Parameters of the masking layer process phase space can also affect the masking layer process. As an example, variances in concentration of process constituents can have a large affect on the masking layer process relative to some other parameters of the phase space. Variances in reaction time of the process can have a relatively small affect on the masking layer process. Variances in temperature of the process environment can also affect the masking layer process. Other parameters like annealing, incubation time, pH and alcohol concentration, to name a few, can also affect the masking layer process.

Figure 5:
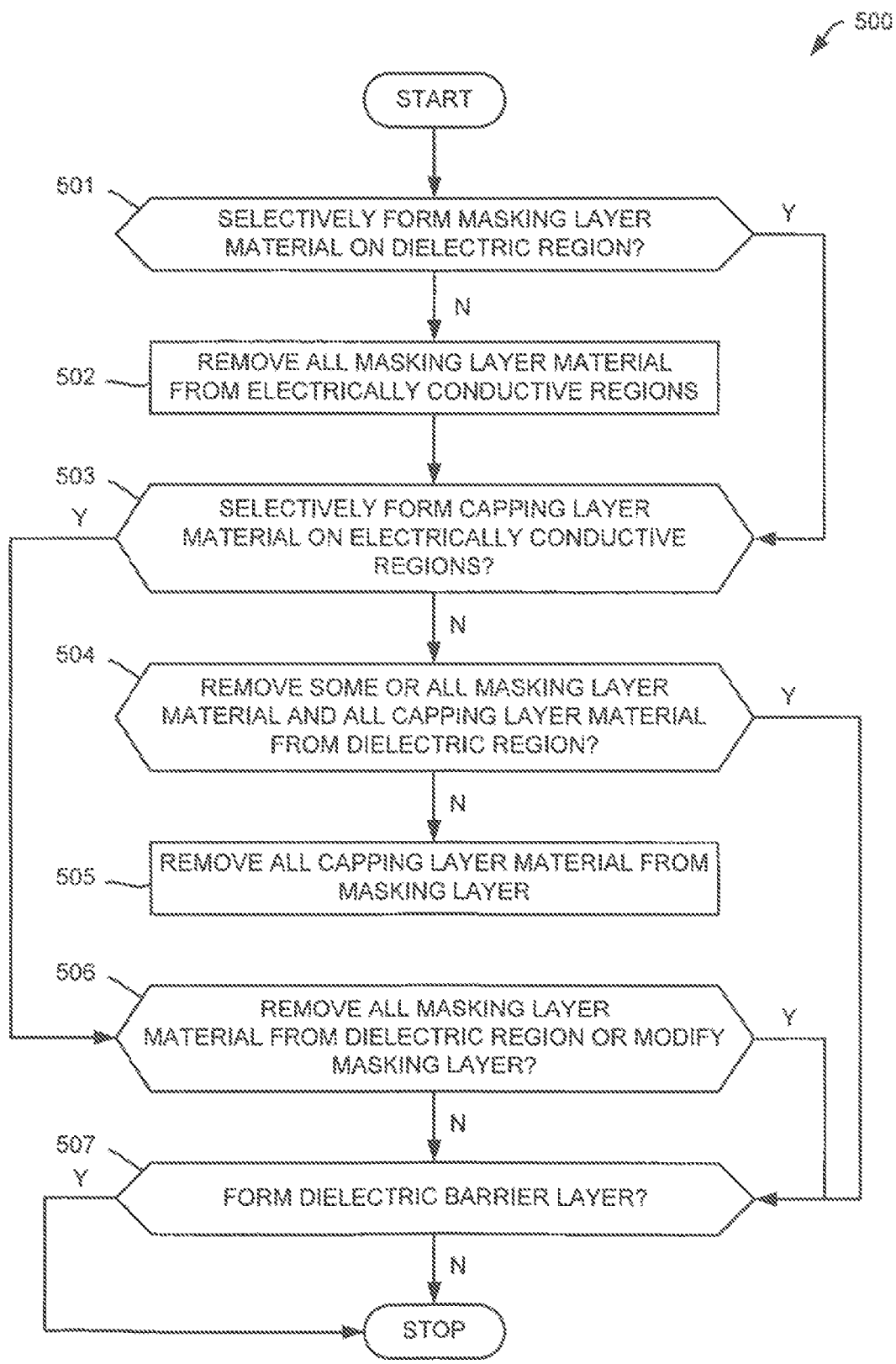
FIG. 5 is a flow diagram for generating a capping layer on regions of a substrate including use of a masking layer, under an embodiment.

As a more specific example of masking layer use in IC fabrication, FIG. 5 is a flow diagram for generating 500 a capping layer on regions of a substrate including use of a masking layer, under an embodiment. Generally, a masking layer is formed 501-502 on the electronic device so that the masking layer is formed on the dielectric region, but not the electrically conductive regions. After formation 501-502 of the masking layer, a capping layer is formed 503-506 on the electronic device so that the capping layer is formed on the electrically conductive regions, but not on or in the dielectric region or the masking layer. The presence of the masking layer inhibits formation of capping layer material on or in the dielectric region that may otherwise have occurred if the masking layer was not present, with attendant benefits as described in more detail elsewhere herein. Further, capping layer generation 500 can be implemented in any of several ways, discussed in more detail below, to inhibit formation of capping layer material on or in the masking layer.

Capping layer generation 500 produces a capping layer so that capping layer material is formed only on the electrically conductive regions (no or negligible capping layer material is formed over, on or in a dielectric region separating electrically conductive regions). This eliminates unacceptable current leakage between electrically conductive regions that has been a problem with previous approaches to depositing a metallic capping layer that have not achieved sufficient selectivity in forming capping layer material on the electrically conductive regions in preference for dielectric regions separating the electrically conductive regions.

More specifically, capping layer generation 500 begins by forming a masking layer on regions of an electronic device. The generation 500 of an embodiment includes selectively forming 501 a masking layer on an electronic device so that the resulting masking layer is formed only on a dielectric region of the electronic device, but not on the electrically conductive regions of the electronic device that are separated by the dielectric region. Alternatively, the masking layer can be non-selectively formed on both the dielectric region and the electrically conductive regions, in which case all masking layer material formed on the electrically conductive regions is subsequently removed 502.

Following formation 501-502 of the masking layer on the dielectric regions of the electronic device, a capping layer is formed 503-506 on the electronic device so that the resulting capping layer is formed on the electrically conductive regions, but not on or in the masking layer and/or the dielectric region. The capping layer can be formed using one or more materials and/or processes as described herein that produce a capping layer that provides necessary or desirable functions or properties of the capping layer as appropriate to the substrate.

The capping layer of an embodiment is formed selectively 503 on the electrically conductive regions of the device. Following selective capping layer formation 503, the masking layer material can be removed 506 from the dielectric regions of the device or, alternatively, the material of the masking layer can be modified as appropriate to one or more subsequent processes. Further, a dielectric barrier layer can be formed 507 on regions of the device.

Alternatively, the capping layer can be formed non-selectively 503 on both the masking layer and the electrically conductive regions. In one alternative embodiment under which the capping layer is formed non-selectively 503 on the masking layer and the electrically conductive regions, all material (e.g., capping layer and masking layer material) previously formed on the dielectric regions of the device is removed 504 in a single process. A dielectric barrier layer can subsequently be formed 507 on regions of the device.

In another alternative embodiment under which the capping layer is formed non-selectively 503 on the masking layer and the electrically conductive regions, capping layer and masking layer material is removed using numerous processes instead of removing 504 all material in a single process. Under this alternative embodiment, all capping layer material non-selectively formed on the masking layer is first removed 505. All masking layer material previously formed on the dielectric regions of the device is then removed 506 from the dielectric regions; alternatively, the material of the masking layer can be modified as appropriate to one or more subsequent processes. A dielectric barrier layer can subsequently be formed 507 on regions of the device.

The presence of the masking layer prevents formation of capping layer material on or in (through diffusion) the dielectric region, thus enforcing good selectivity of the capping layer material for the electrically conductive regions regardless of the selectivity otherwise associated with the materials and processes used to form the capping layer. The presence of the masking layer therefore prevents residual electrically conductive material that may be left on the dielectric region after a planarization process (e.g., chemical mechanical polishing) from promoting undesired nucleation of capping layer material on the dielectric region, and also facilitates the use of porous dielectric materials that may otherwise be unacceptably susceptible to diffusion of capping layer material. Thus, the masking layer provides increased flexibility in the materials and processes that can be used to form the capping layer, since the above-described concerns that must be accommodated if no masking layer is present are alleviated. For example, as described above, the embodiments herein enable use of materials and processes for depositing a capping layer (e.g., electrically conductive capping layer) that have previously been inadequate to form a capping layer without producing unacceptable current leakage between electrically conductive regions, but that are effective in inhibiting electromigration because of good adhesion to electrically conductive regions.

Additionally, since the presence of the masking layer enables production of a capping layer by forming additional material on an electrically conductive region, there is no need to create a capping layer by chemically modifying a top part of the electrically conductive region. Thus, the undesirable increase in resistance in the electrically conductive region that is associated with creation of a capping layer in that manner is avoided.

As indicated above, when the capping layer is formed non-selectively on both the masking layer and the electrically conductive regions, all capping layer material formed on the masking layer is subsequently removed so that no (or negligible) capping layer material is present over the dielectric region. This eliminates the possibility of current leakage between the electrically conductive regions when an electrically conductive material is used to form the capping layer. In accordance with the usage herein of selective formation of a capping layer, it is not necessary to remove capping layer material from the masking layer when the capping layer is selectively formed on the electrically conductive regions. However, it may be desirable to remove capping layer material from the masking layer, and this can be done by removing just the capping layer material from the masking layer (at 505 described above), or by removing some (e.g., a top part on which the capping layer material is formed) or all of the masking layer together with the capping layer material formed thereon (at 504 described above).

In general, any appropriate processes can be used to remove capping layer material from over the dielectric region. Typically, the removal processes include processes that detach the capping layer material, or some or all of the masking layer together with the capping layer material, followed by rinsing that removes the detached material from the electronic device. The processes used can depend on whether only capping layer material is to be removed, some of the masking layer is to be removed together with the capping layer, or the entire masking layer is to be removed together with the capping layer. Additionally, processes used can depend on the characteristics and properties of the capping layer material, the masking layer and the material used to form the dielectric region. For example, a masking layer can be formed (or functionalized) so that a top part of the masking layer can be cleaved from the rest of the masking layer when subjected to appropriate processing, as described above. Also, a molecularly self-assembled masking layer can be formed so that the organic backbone of the molecularly self-assembled masking layer can be broken down and removed when subjected to appropriate processing.

Considering the masking layer generation 500 described above, FIG. 6A is a cross-sectional view of a structure 600 including a dielectric region 601 on which a masking layer 602 is formed. The masking layer 602 is a self-assembled monolayer (SAM) but is not so limited. The SAM includes, but is not limited to, a binding group 602a formed on the dielectric region 601, a linking group 602b connected to the binding group 602a, and a terminal group 602c, connected to the linking group 602b, on which material can subsequently be formed. Without modification, the masking layer 602 has characteristics, with respect to formation of material on the electronic device subsequent to formation of the masking layer, in accordance with the nature of the terminal group 602c used in the masking layer 602.

Figure 6A:
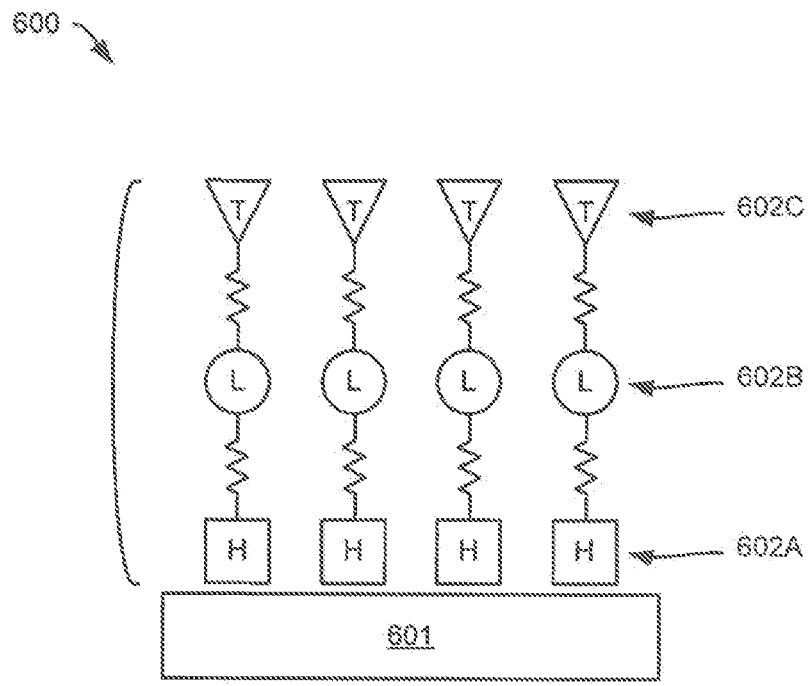
FIG. 6A is a cross-sectional view of a structure including a dielectric region on which a masking layer is formed, under an embodiment.
Figure 6B:
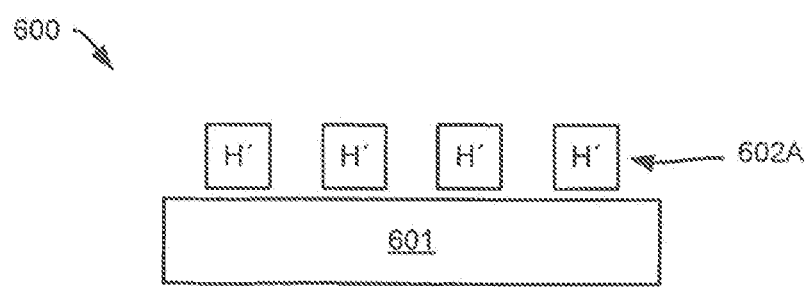
FIGS. 6B through 6D are cross-sectional views of the structure after further processing to modify the masking layer, under an embodiment.
Figure 6C:
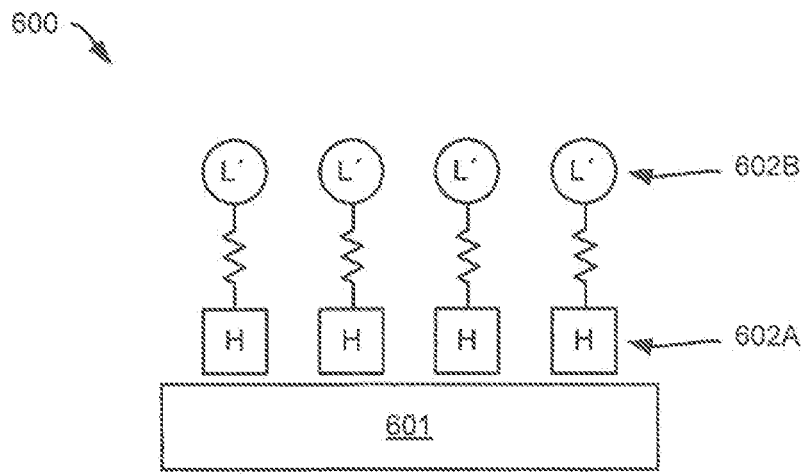
Figure 6D:
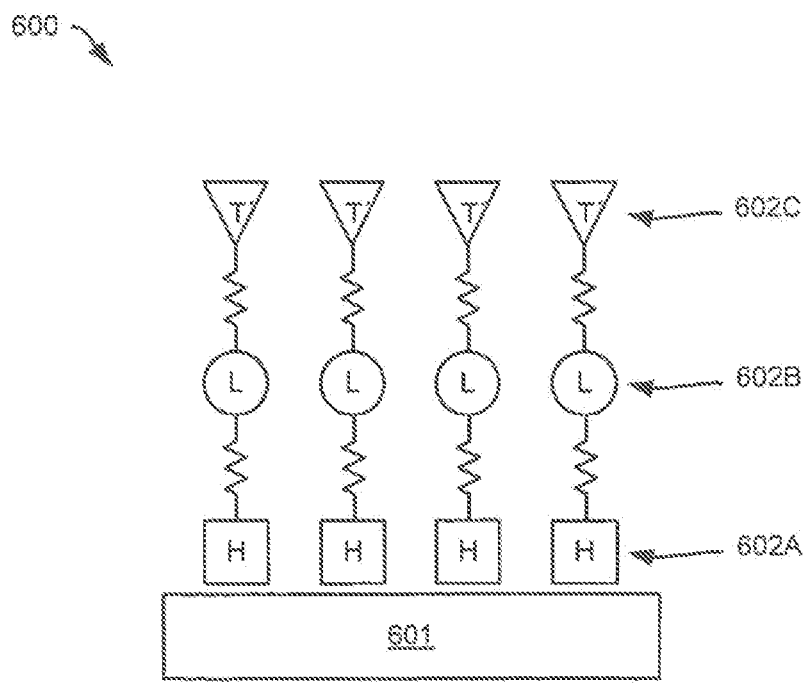

FIGS. 6B through 6D are cross-sectional views of the structure 600 after further processing to modify the masking layer 602 in a manner intended to produce desired characteristics of the masking layer with respect to formation of material on the electronic device subsequent to formation of the masking layer and, in particular, one or more characteristics that are different from those provided by the unmodified terminal group 602c of the masking layer 602, as described above. Each of FIGS. 6B through 6D illustrates a different general type of approach that can be used to modify the masking layer 602.

In FIG. 6B, the binding group 602a of the masking layer 602 is cleaved, removing part of the binding group 602a, all of the linking group 602b and all of the terminal group 602c of the masking layer 602; the part of the binding group 602a remaining on the dielectric region 601 (designated as H' in FIG. 6B to indicate that characteristic(s) are provided that are different from those provided by the unmodified head group 602a of FIG. 6A) provides the desired characteristics for the masking layer 602.

In FIG. 6C, the linking group 602b of the masking layer 602 is cleaved, removing part of the linking group 602b and all of the terminal group 602c of the masking layer 602; the part of the linking group 602b remaining on the dielectric region 601 (designated as L' in FIG. 6C to indicate that characteristic(s) are provided that are different from those provided by the unmodified linking group 602b of FIG. 6A) provides the desired characteristics for the masking layer 602.

In FIG. 6D, the terminal group 602c of the masking layer 602 is cleaved, removing part of the terminal group 602c of the masking layer 602; the part of the terminal group 602c remaining on the dielectric region 601 (designated as T' in FIG. 6D to indicate that characteristic(s) are provided that are different from those provided by the unmodified terminal group 602c of FIG. 6A) provides the desired characteristics for the masking layer 602.

There are other general types of approaches, described above, that can be used to modify a masking layer. For example, in the structure 600, the bond between the binding group 602a and the linking group 602b can be broken, resulting in the removal of the linking group 602b and the terminal group 602c of the masking layer 602; the binding group 602a remaining on the dielectric region 601 provides the desired characteristic(s) for the masking layer 602. The bond between the linking group 602b and the terminal group 602c could be broken, resulting in the removal of the terminal group 602c of the masking layer 602; the linking group 602b remaining on the dielectric region 601 provides the desired characteristic(s) for the masking layer 602. The terminal group 602c could be functionalized (rather than cleaved); the modified terminal group 602c provides the desired characteristic(s) for the masking layer 602. Further, in each of the other general types of approaches described above (e.g., cleaving the binding group 602a, linking group 602b or terminal group 602c, or breaking the bond between the head group 602a and the linking group 602b or between the linking group 602b and the terminal group 602c) the exposed part of the masking layer 602 can be functionalized to produce desired characteristics.

There are numerous ways in which the above-described general approaches to modifying a masking layer can be implemented. The particular implementation can depend on the particular structure and/or materials of the binding group 602a, linking group 602b and/or terminal group 602c of the masking layer 602, and/or on the bond(s) formed there between. Those skilled in the art can appreciate how such general approaches may be particularly implemented using, for example, appropriate chemical or electrochemical processing, in view of the particular structure and/or materials of the binding group 602a, linking group 602b and/or terminal group 602c of the masking layer 602, and/or the bond(s) formed there between, together with the description given above.

For example, the masking layer can be configured to inhibit formation thereon of material used to form the capping layer and promote adhesion to material used to form a dielectric barrier layer. This can be accomplished by establishing the terminal group of a molecule used to form a masking layer (e.g., specifying the molecule to include a particular terminal group, cleaving the terminal group of the molecule and/or functionalizing the terminal group) to inhibit formation of material used to form the capping layer and promote adhesion to material used to form a dielectric barrier layer. Alternatively, this is accomplished by establishing the terminal group of a molecule used to form a masking layer to inhibit formation of material used to form the capping layer, then modifying (i.e., cleaving and/or functionalizing) the terminal group to promote adhesion to material used to form a dielectric barrier layer.

As described above, silane-based masking layers can be tailored to promote or inhibit the formation of particular material thereon, which can be useful in facilitating selective formation of a capping layer and/or promoting adhesion of a dielectric barrier layer formed on a masking layer. The properties of the exposed surface of a silane-based masking layer can be controlled through use of appropriately substituted silane precursors. For example, a masking layer formed from reaction of octadecyltrichlorosilane is expected to produce an exposed surface free of reactive functionality (i.e., saturated hydrocarbyl only). By contrast, a masking layer formed from reaction of aminopropyltrimethoxysilane is expected to produce an exposed surface featuring a high density of amine functionality. The hydrocarbyl surface would be expected to provide a poor surface for nucleation of material formed using an electroless deposition process, while the amine-functionalized surface would be expected to promote such nucleation. More generally, silane precursors with alkyl, aryl, fluoroalkyl or fluoroaryl substituents can be used to produce an exposed surface free of reactive functionality, while exposed masking layer surfaces containing reactive functionality such as hydroxyl, amino, mercapto, carboxy, or other functional groups can be produced through the use of appropriately substituted silane precursors, as can be appreciated by those skilled in the art. Thus, the exposed surface properties of a silane-based masking layer can be controlled to inhibit formation of capping layer material on the masking layer.

The characteristics of a masking layer can also be established to produce desired diffusion barrier properties. In particular, the characteristics of the masking layer can be established so that the masking layer provides a good barrier to diffusion of the capping layer material and/or materials used in the formation of the capping layer. Establishing the characteristics of the masking layer to inhibit diffusion can be increasingly advantageous as the porosity of dielectric materials used in an application of an embodiment increases. For example, it is anticipated that the embodiments will sometimes be implemented using a cobalt alloy (e.g., a cobalt-tungsten-phosphorous alloy) to form the capping layer. In that case, the characteristics of the masking layer can be established so that the masking layer provides a good barrier to diffusion of cobalt alloys and/or alloy precursors.

Further examples follow of masking layer generation 300 in substrate processing. The examples described below with reference to FIGS. 7-11 describe a research and development protocol that can be used for initial characterization of a processed substrate, and these initial characterizations include prescans and postscans; however, the prescans and postscans described herein are not included in an actual implementation of the masking layer of an embodiment.

FIG. 7 is a block diagram of a masking layer process flow 700, under an embodiment. The masking layer process flow includes, but is not limited to, a preclean 701 of the substrate, masking layer deposition 703 on the substrate surface, and a postscan 704 of the substrate with the integrated masking layer. The process flow 700 includes cleaning 705 of the substrate with the masking layer in order to remove spurious masking layer material that may contaminate a conductor and to provide an adequate surface for selective metal deposition for example. The process flow 700 also includes a postscan 706 of the cleaned substrate and masking layer, deposition 707 of one or more additional chemicals, and a postscan 708 of the processed substrate.

FIG. 8 is a block diagram of a masking layer process flow 800, under an alternative embodiment. The masking layer process flow includes, but is not limited to, a preclean 801 of the substrate using a Laurell spinner. An ellipsometer prescan 802 is performed on the cleaned substrate, and the masking layer is deposited 803 on the substrate surface. The masking layer deposition 803 includes deposition of a silane composition but is not so limited. The masking layer, which serves to precondition the substrate surface, acts as a selective wetting agent and, in contrast to typical processing schemes, is deployed in a unique sequence apart from the bulk chemistry of the processing. An ellipsometer postscan 804 is performed on the substrate with the integrated masking layer. A contact angle scan is also performed. The process flow 800 includes cleaning 805 of the substrate with the masking layer, where the cleaning 805 is a MR-10 clean at the Laurell spinner. The process flow 800 also includes an ellipsometer postscan 806 of the cleaned substrate and masking layer, electroless deposition 807 of one or more additional chemicals, and another ellipsometer postscan 808 of the processed substrate.

FIG. 9 is a block diagram of a masking layer process flow 900, under another alternative embodiment. The masking layer process flow includes, but is not limited to, a surface clean 901 of the substrate and a copper clean 903. The masking layer process 900 continues with masking layer deposition 905 on the substrate surface, of the substrate with the integrated masking layer. The process flow 900 also includes deposition 907 of one or more additional chemicals, and a scan 908 of the processed substrate.

FIG. 10 is a block diagram of a masking layer process flow 1000, under yet another alternative embodiment. The masking layer process flow 1000 includes, but is not limited to, masking layer deposition 1001 on the substrate surface, a number (e.g., number 1, ... N) of cleans 1003 of the substrate with the masking layer, electroless deposition 1005 of one or more additional materials, and another clean 1007.

FIG. 11 is a block diagram of a masking layer process flow 1100, under still another alternative embodiment. The masking layer process flow 1100 includes, but is not limited to, a number (e.g., number 1, ... N) of cleans 1101 of the substrate with the masking layer, masking layer deposition 1103 on the substrate surface, electroless deposition 1105 of one or more additional materials, and another clean 1107.

The masking layer process conditions of an embodiment include both aqueous and organic process conditions. Aqueous process conditions generally include dissolving an organic silane (—Cl, —NR$_2$, or —OR) precursor in water so as to hydrolyze the silane and generate an aqueous hydroxy silane. The final hydrolyzed solution likely includes a mixture of monomeric trihydroxysilanes and oligomeric hydroxyl bearing siloxanes that can also act as masking layer precursors. As one example of an aqueous process condition, a 500 mM solution of a trimethoxysilane precursor is dissolved in water and allowed to stir for approximately 24 hours. The solution is then mixed in a 4-to-1 ratio with 80 degree Celsius water (final concentration is approximately 100 mM), and deposition proceeds for 120 seconds at 70 degrees Celsius.

In general trihydroxysilanes (silane tirols) are considered to be highly reactive species, quickly condensing to form highly crosslinked networks. However there are several notable exceptions. One example is a family including silane triols substituted with polar poly or oligo(ethyleneoxide) groups. These molecules are known to be mostly monomeric in solution with some dimer and trimer appearing when the solution is highly concentrated. (J. D. Birchall, J. D. Carey, A. J. Howard; *Nature,* 1977 Vol. 266 (10) 154-156). Other polar functional groups can also stabilize aqueous silane solutions including but not limited to ureas, carbamates, quaternary ammonium salts, sulfonic acids or sufonate salts, caboxillic acids or carboxylate salts, phosohonate esters, phosphonic acids or phosphonate salts, amines, amides, alcohols, ethers, zwitterions, as well as polymers and oligomers containing more than one of the aforementioned functional groups.

Figure 12:
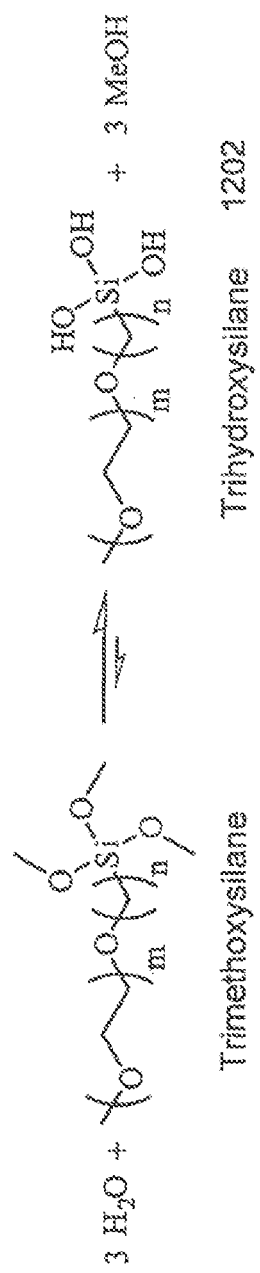
FIG. 12 shows preparation of the trihydroxysilane, under an embodiment.
Figure 13:
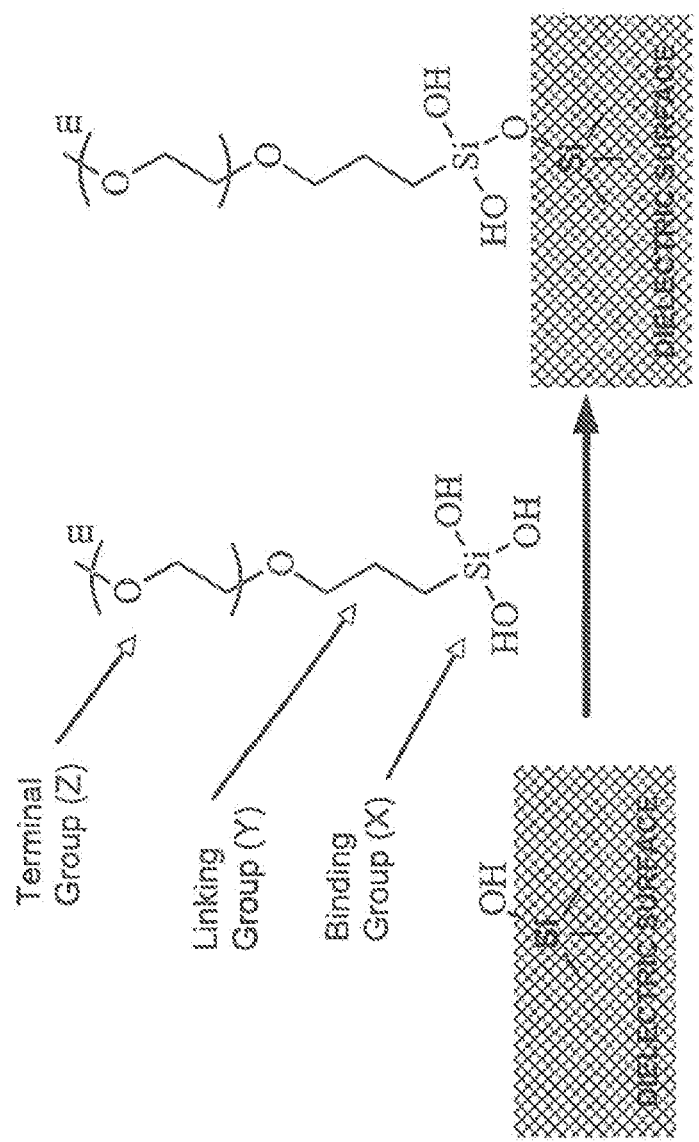
FIG. 13 shows silane deposition on a dielectric, under an embodiment.

In a specific example a 10 mM aqueous solution of a trihydroxysilane is prepared by dissolving the corresponding trimethoxysilane in water and allowing hydrolysis to proceed for 24 hours. FIG. 12 shows preparation of the trihydroxysilane 1202, under an embodiment. This silane 1202 comprises an oligomeric PEG (polyethyeneglycol) unit capped by a methyl group at one end and linked by an aliphatic carbon chain to a trhyhydroxysilane at the other end. In the present embodiment a mixture of molecules is used in which m ranges from five (5) to ten (10) and n is equal to three (3). Both m and n can be changed to tune the properties of the solution and the layer. The silane solution is used to deposit silane on the dielectric regions of a precleaned full wafer using a Laurell spinner at a temperature between room temperature and 100° C. FIG. 13 shows silane deposition on a dielectric, under an embodiment. A cobalt alloy capping layer can be applied, following masking layer deposition, according to one or more protocols in the art.

The integration of a masking layer with a substrate as described above provides a number of enhancements to the substrate. One enhancement involves the issue of substrate sensitivity. Tailoring surface chemistry is particularly important for wet processing. Unlike dry processing where surface tension does not play a role, chemistry that takes place at the interface between a liquid and a solid surface requires low surface energy. Surface tension is especially critical if the liquid must penetrate in between high aspect ratio features. In the case of electroless deposition, a narrow copper line that is surrounded by hydrophobic dielectric material will not wet and therefore not be effectively exposed to the solution chemistry. This problem is exacerbated by the fact that after CMP copper lines are generally recessed relative to the dielectric. As line widths continue to shrink wettability of the dielectric is expected to become more and more important for any wet processing step.

There are several other situations where surface chemistry is critically important to the success of wet processing steps. Particulates are often formed during wet processing steps, including electroless deposition. Whether or not these particles adhere to the dielectric surface can determine the success or failure of the process. Additionally, the zeta potential of the surface can affect the local chemical behavior. In other cases it may be desirable for species in solution to adhere to the substrate surface. In this case the strength and specificity of the binding interaction is controlled by the nature of the surface.

The masking layer eliminates or reduces the issue of substrate sensitivity from the electroless deposition processing. The masking layer is designed to bind to various dielectric surfaces only, and its wetting character is compatible with and does not cause interference with electroless deposition processing. As result, it allows a cobalt capping layer for example to be deposited selectively through electroless deposition to a copper surface without any interference from the substrate or the other upstream processes.

Figure 14:
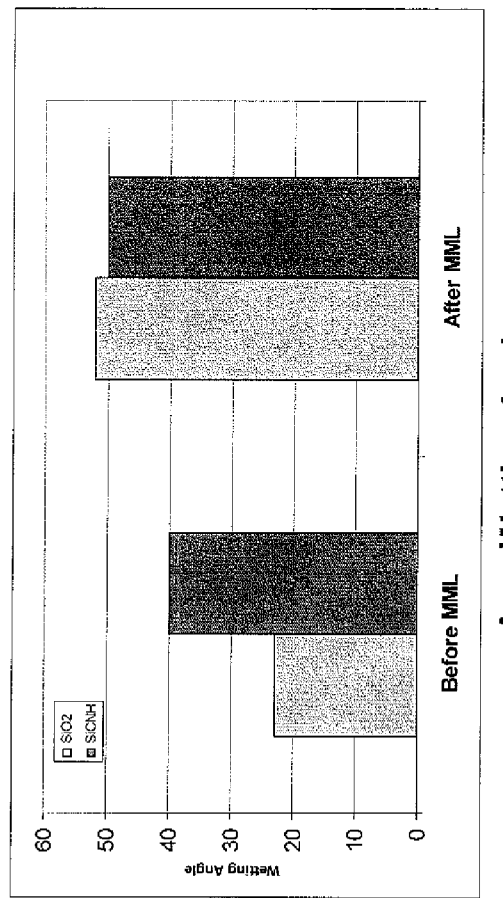
FIG. 14 is a masking layer application example showing normalization of the substrate with the masking layer, under an embodiment.

As an example of modification of surface characteristics, FIG. 14 is a masking layer application example showing normalization of the substrate with the masking layer, under an embodiment. The normalization of this example involves normalization of the wetting angle or wetting contact angle but is not so limited. More specifically, this example shows the difference in the wetting angle between each of two different surfaces with the masking layer and absent the masking layer, under an embodiment. The desired characteristics of the substrate surface are achieved by manipulation or configuration of the Z site and/or the Y site, as described above. The example data shows significant differences in the average wetting angle of an oxide surface (e.g., 21-25 degrees) and the average wetting angle of a carbide surface (e.g., 38-42 degrees) absent the masking layer. Following integration of the masking layer of an embodiment, the average wetting angle is normalized between the two surfaces so that the differences in average wetting angles are reduced or eliminated. The example data shows reduced differences in the average wetting angle of the oxide surface with the masking layer (e.g., 50-54 degrees) and the average wetting angle of the carbide surface with the masking layer (e.g., 48-52 degrees).

Figure 15B:
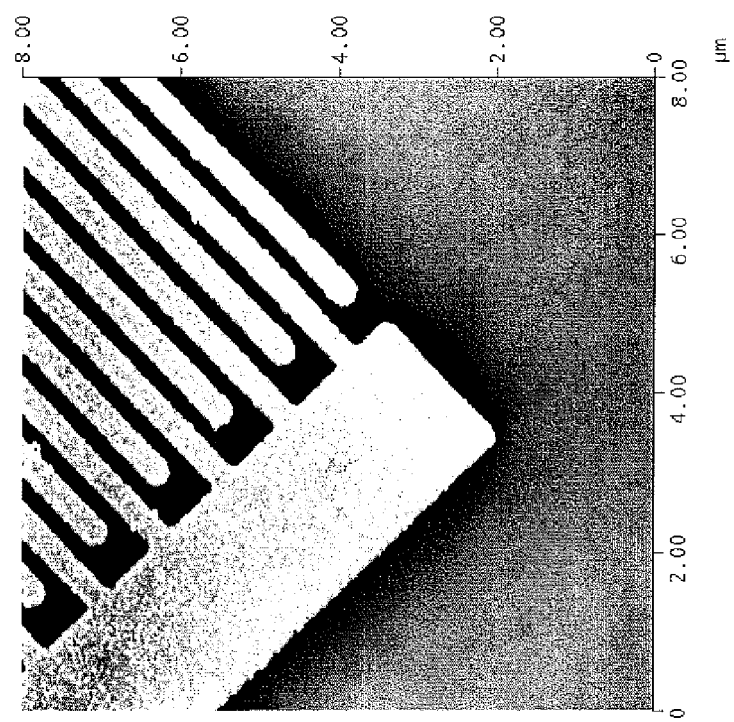
FIG. 15B is an image of a comb structure (YB9) that includes a masking layer, under an embodiment.
Figure 15A:
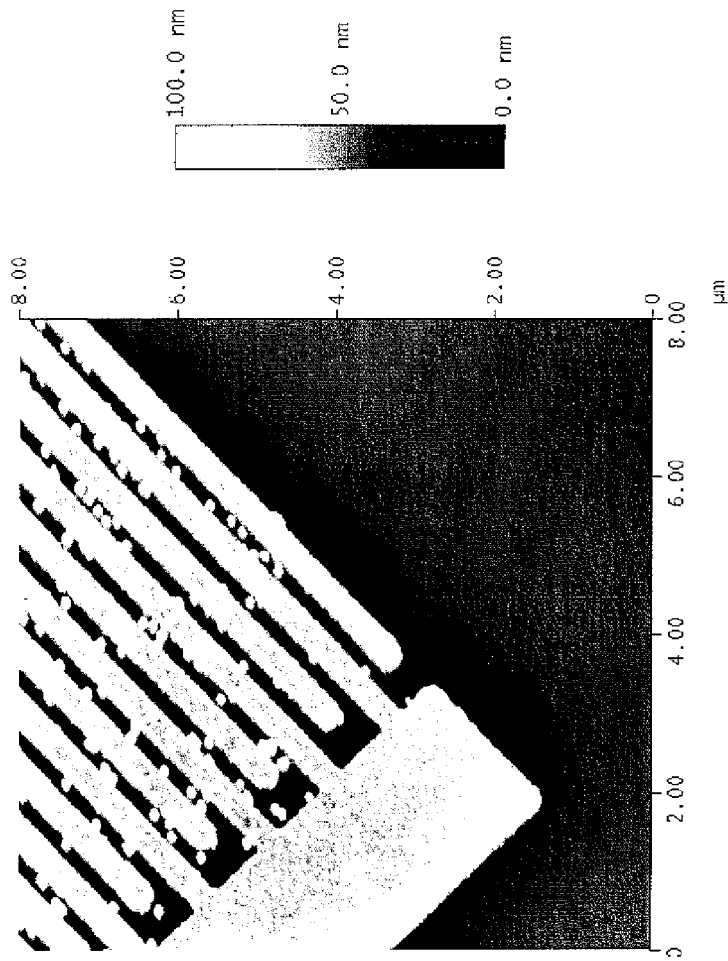
FIG. 15A is a control image of a comb structure (YB9) devoid of a masking layer.

The masking layer also reduces or dissuades particle formation on the substrate and therefore reduces or eliminates defects generated from substrate processing. FIG. 15A is a control image of a comb structure (YB9) devoid of a masking layer. This control image shows the presence of numerous particles on the dielectric surface of the comb. FIG. 15B is an image of a comb structure (YB9) that includes a masking layer, under an embodiment. It can be seen that the comb structure including the masking layer includes relatively few particles when compared to the control image without the masking layer.

Use of the masking layer also improves selectivity of the substrate (e.g., 10 times to 100 times), which is demonstrated with an improvement or reduction in leakage current. Degree of leakage represents selectivity of the system because lower leakage is an indicator of better isolation which is found in a more selective system; in contrast, higher leakage results from particle contamination which is found in a less selective system. The masking layer thus makes a system that might generally have an acceptable leakage more manufacturable because it improves and guarantees the selectivity of the system.

Figure 16A:
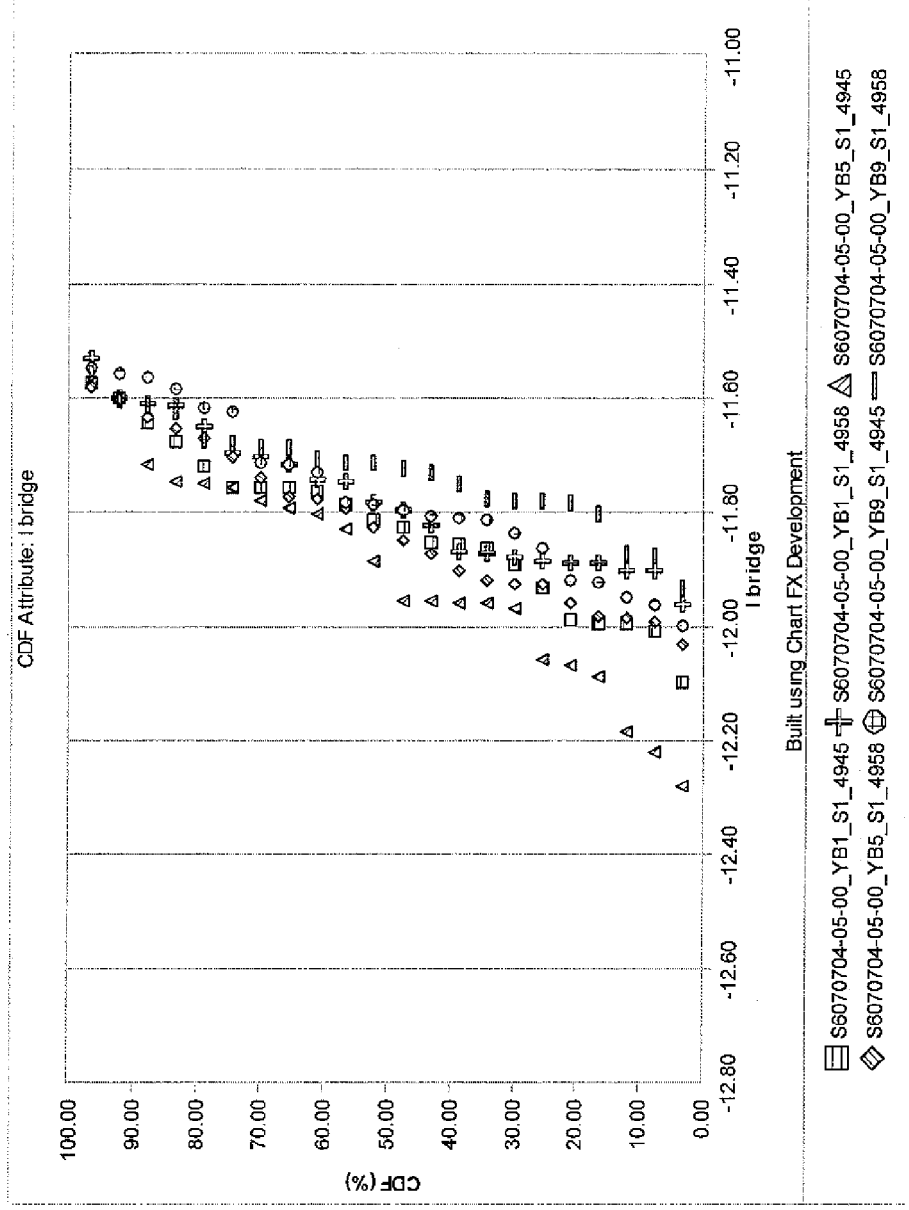
FIG. 16A shows a plot of leakage current versus cumulative distribution function (CDF) (%) of samples before and after conventional electroless cobalt deposition with the masking layer described above, under an embodiment.

Improved electrical performance is observed for wafers treated with a masking layer versus control wafers. Most notably the leakage current can be reduced by several orders of magnitude relative to the control. As an example of a reduction in leakage current resulting from use of the masking layer, FIG. 16A shows a plot of leakage current versus cumulative distribution function (CDF) (%) of samples before and after conventional electroless cobalt deposition with the masking layer described above, under an embodiment. In comparison, FIG. 16B shows a plot of leakage current versus cumulative distribution function (CDF) (%) of samples before and after conventional electroless cobalt deposition without the use of the masking layer.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the substrate processing is not intended to be exhaustive or to limit the substrate processing to the precise form disclosed. While specific embodiments of, and examples for, the substrate processing are described herein for illustrative purposes, various equivalent modifications are possible within the scope of the substrate processing, as those skilled in the relevant art will recognize. The teachings of the substrate processing provided herein can be applied to other processing systems and methods, not only for the systems and methods described above.

The elements and acts of the various embodiments described above can be combined to provide further embodiments. These and other changes can be made to the substrate processing in light of the above detailed description.

In general, in the following claims, the terms used should not be construed to limit the substrate processing to the specific embodiments disclosed in the specification and the claims, but should be construed to include all processing under the claims. Accordingly, the substrate processing is not limited by the disclosure, but instead the scope of the substrate processing is to be determined entirely by the claims.

While certain aspects of the substrate processing are presented below in certain claim forms, the inventors contemplate the various aspects of the substrate processing in any number of claim forms. Accordingly, the inventors reserve the right to add additional claims after filing the application to pursue such additional claim forms for other aspects of the substrate processing.

What is claimed is:

1. A substrate comprising:
   a plurality of conductive regions including electrically conductive material;
   a plurality of dielectric regions interleaved with the conductive regions; and a masking layer formed along a surface of the dielectric region, such that the surface of the dielectric region is normalized, wherein the masking layer includes a plurality of constituents, and wherein at least one of the constituents is selected for compatibility with a subsequent process;

wherein the plurality of constituents comprises:
a head group selected from the group consisting of: a polyethylene oxide and an oligoethylene oxide, the head group configured for attachment with the substrate;
a terminal group selected for providing control of the at least one characteristic; and
a linking group for linking the head group with the terminal group.

2. The substrate of claim 1, wherein the masking layer is selected to control at least one characteristic of the substrate surface, the at least one characteristic selected from the group consisting of: wetting contact angle, zeta potential, particle binding affinity, and adhesive properties.

3. The substrate of claim 1, wherein the polyethylene oxide is selected from the group consisting of: 2-[Methoxy(polyethyleneoxy)propyl]tris(dimethylamino)silane, 2-[Methoxy(polyethyleneoxy)propyl]dimethylaminodimethylsilane, and Bis[3-tris(dimethylamino)silylpropyl]polyethyleneoxide.

4. The substrate of claim 1, wherein the head group includes a compound having the formula:

$O(C_2H_4O)_n CH_3$, wherein n is an integer.

5. The substrate of claim 1, wherein the linking group includes a compound having the formula:

$(CH_2)_n$, wherein n is an integer.

6. The substrate of claim 1, wherein the terminal group is selected from the group consisting of: Si—$Cl_n$ molecules, Si—$(OR)_n$ molecules, and Si—$(OH)_n$ molecules, wherein variable n represents an integer between 1 and 3, wherein R represents molecules of at least one aliphatic group.

7. The substrate of claim 6, wherein R is selected from the group consisting of:
methyl groups, ethyl groups, methyl-ethyl (isopropyl) groups, butyl groups, and combinations of at least one of the methyl groups, the ethyl groups, the methyl-ethyl (isopropyl) groups, and the butyl groups.

8. The substrate of claim 1, wherein the terminal group is selected from the group consisting of: a tris(dimethyamino) silane, a trihydroxysilane, trimethoxysilane, and a mixed methoxy/hydroxysilane.

9. The substrate of claim 8, wherein the trihydroxysilanes are stabilized by addition of a compound selected from the group consisting of: ureas, carbamates, quaternary ammonium salts, sulfonic acids or sufonate salts, caboxillic acids, carboxylate salts, phosohonate esters, phosphonic acids, phosphonate salts, amines, amides, alcohols, ethers, and zwitterions.

10. The substrate of claim 1, wherein the dielectric region is selected from the group consisting of: $SiO_2$, $SiC_xN_yH_z$, $SiC_xO_yH_z$, FSG, SiCOH, porous SiCOH, MSQ $SiC_x$, $SiN_x$, and $SiC_xN_y$, wherein each of variables X, Y, and Z represents a rational number.

* * * * *